US00RE39253E

(19) United States
(12) Reissued Patent
Katayama et al.

(10) Patent Number: US RE39,253 E
(45) Date of Reissued Patent: Aug. 29, 2006

(54) APPARATUS AND METHOD FOR ERROR CORRECTION

(75) Inventors: Yukari Katayama, Chigasaki (JP); Shoichi Miyazawa, deceased, late of Yokohama (JP); by Yukie Miyazawa, legal representative, Yokohama (JP); Hitoshi Ogawa, Yokohama (JP); Masatoshi Nishina, Ohiso-machi (JP)

(73) Assignee: Hitachi, Ltd., Tokyo (JP)

(21) Appl. No.: 09/599,395

(22) Filed: Jun. 22, 2000

Related U.S. Patent Documents

Reissue of:
(64) Patent No.: 5,771,248
Issued: Jun. 23, 1998
Appl. No.: 08/516,927
Filed: Aug. 18, 1995

(30) Foreign Application Priority Data

Aug. 18, 1994 (JP) ..... 6-194302

(51) Int. Cl.
*G11C 29/00* (2006.01)

(52) U.S. Cl. ..... 714/763; 714/752
(58) Field of Classification Search ..... 714/781, 714/763, 769, 785, 752, 764, 774, 798
See application file for complete search history.

(56) References Cited

U.S. PATENT DOCUMENTS 5,257,270 A * 10/1993 Hilden et al. ..... 714/781
5,511,078 A * 4/1996 Barucchi et al. ..... 714/763
5,586,127 A * 12/1996 Moriuchi ..... 714/769
5,598,422 A * 1/1997 Longwell et al. ..... 714/785

FOREIGN PATENT DOCUMENTS

EP 0 243 708 * 11/1987
EP 0 503 859 A3 * 9/1992
EP 0 503 859 A2 * 9/1992

* cited by examiner

*Primary Examiner*—David Ton
(74) *Attorney, Agent, or Firm*—Antonelli, Terry, Stout & Kraus, LLP

(57) ABSTRACT

Apparatus for recording and/or reproducing user data recorded on a record medium. The apparatus includes record encoder for converting original user data into encoded user data of a predetermined record code and as error correcting code generator for generating original error correcting code data for correcting an error with respect to the encoded user data. A write unit records the encoded user data and the error correcting code on the record medium. A read unit reads the recorded data and the reproduced data is error corrected so as to provide the original user data.

21 Claims, 25 Drawing Sheets

FIG. 5(a)

0 1 1 0 0 0 0 1 0 1 0 0 1 1 0 0 0 0 1 1

NO LESS THAN 0

NO MORE THAN 4

FIG. 5(b)

0 1 0 0 0 0 1 1 0 1 0 0 0 1

NO MORE THAN 4

ODD NUMBER SERIES

EVEN NUMBER SERIES

FIG. 6

| | | | | | | | | | | | | | | | |
|---|---|---|---|---|---|---|---|---|---|---|---|---|---|---|---|
| ODD NUMBER SERIES | ○ | ○ | ○ | ○ | ○ | × | ○ | ○ | × | ○ | ○ | ○ | ○ | ○ | ○ |
| EVEN NUMBER SERIES | ○ | ○ | ○ | ○ | ○ | ○ | ○ | ○ | ○ | ○ | ○ | ○ | ○ | ○ | ○ |

NO MORE THAN 4

×: ERROR BIT

○: NORMAL BIT

1101 RLL REDUNDANT CODE RECOVERING CIRCUIT
1102
FIFO
1103 SYNDROME CALCULATING CIRCUIT
1104
0 DETECTING CIRCUIT
ERROR POSITION CALCULATING CIRCUIT 1105
1106
1107
1108
1109
1110
1111
1112
1113
1114
1115
1116
1117
1118
1119
1120
1121
1122
1123
1124
1125
1130 DUMMY ERROR ADDING CIRCUIT
1131
1132
1133
115
OUTPUT
INPUT
MULTI-PLEXER 1123
COUNT-ER 1
COUNT-ER 2
SERIAL/PARALLEL CONVERSION
FIFO
SEQUENCER
0 DE-TECTOR
SWITCH
"1"
"0"
S"1
S"2
S"3
S"4
S"5

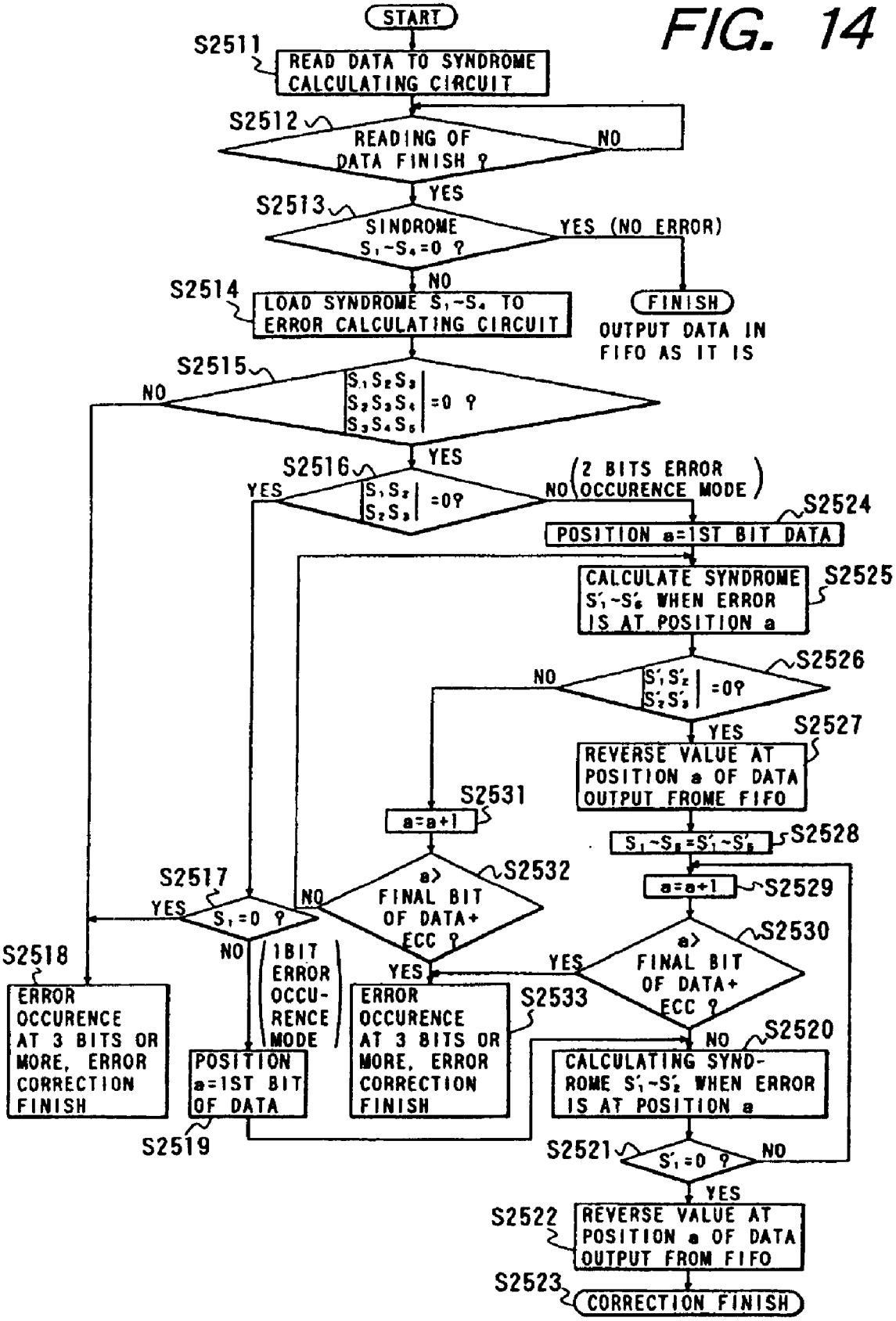
FIG. 14
START
S2511
READ DATA TO SYNDROME CALCULATING CIRCUIT
S2512
READING OF DATA FINISH ?
NO
YES
S2513
SINDROME S1~S4=0 ?
YES (NO ERROR)
NO
FINISH
OUTPUT DATA IN FIFO AS IT IS
S2514
LOAD SYNDROME S1~S4 TO ERROR CALCULATING CIRCUIT
S2515
NO
YES
S2516
YES
NO
(2 BITS ERROR OCCURENCE MODE)
S2524
POSITION a=1ST BIT DATA
CALCULATE SYNDROME S'1~S'6 WHEN ERROR IS AT POSITION a
S2525
S2526
NO
YES
S2527
REVERSE VALUE AT POSITION a OF DATA OUTPUT FROME FIFO
S2531
a=a+1
S1~S3=S'1~S'3
S2528
S2532
a> FINAL BIT OF DATA+ ECC ?
a=a+1
S2529
S2517
YES
S1=0 ?
NO
1BIT ERROR OCCURENCE MODE
S2530
a> FINAL BIT OF DATA+ ECC ?
YES
S2518
ERROR OCCURENCE AT 3 BITS OR MORE, ERROR CORRECTION FINISH
POSITION a=1ST BIT OF DATA
S2519
ERROR OCCURENCE AT 3 BITS OR MORE, ERROR CORRECTION FINISH
S2533
S2520
CALCULATING SYNDROME S'1~S'2 WHEN ERROR IS AT POSITION a
S2521
S'1=0 ?
NO
YES
S2522
REVERSE VALUE AT POSITION a OF DATA OUTPUT FROM FIFO
S2523
CORRECTION FINISH

APPARATUS AND METHOD FOR ERROR CORRECTION

Matter enclosed in heavy brackets [ ] appears in the original patent but forms no part of this reissue specification; matter printed in italics indicates the additions made by reissue.

The present invention relates to encoding/decoding in a recording and reproducing apparatus using a disk type record medium such as a magnetic disk, and particularly to a technology of error correction.

BACKGROUND OF THE INVENTION

A conventional magnetic disk device has a construction as shown in Japanese Unexamined Patent Publication No. 345967/1992. FIG. 26 shows the construction in such conventional technology. Further, a record format of a conventional magnetic disk device is shown in FIGS. 28(a)–28(d). FIG. 28(a) shows an index pulse which is generated once per rotation of a disk, FIG. 28(b) shows sector pulses which are generated at respective sectors, FIG. 28(c) shows a record format, and FIG. 28(d) shows a diagram magnifying the record format of each sector.

In FIG. 26, a magnetic disk device 150 sends and receives data to and from a host computer 101 such as a personal computer or a workstation via an interface bus 102. The magnetic disk device 150 includes a disk 109 of a disk type record medium, an interface controller 103 for controlling of sending and receiving data to and from the host computer 101 via the interface bus 102, a CPU 140 for controlling the inside of the magnetic disk device, a HDC (hard disk controller) 104 for controlling the access of data to the disk, so ECC (error correction code) circuit 105 for adding an error correcting/detecting code, a ENDEC (encoder/decoder) 106 for converting a code having a code form of NRZ into a run length limited code that is adapted to record on the magnetic disk and vice versa, a R/W (read/write) AMP 107 that is an amplifier, a head 108 for reading or recording magnetic information, a data buffer 111 for recording data, and a read control unit 110 for controlling a reading operation.

In FIG. 26, in writing data on the disk 109, firstly, write data which has been inputted from the host computer 101 is stored in the data buffer 111 through the interface bus 102, the interface controller 103 and the HDC 104. Next, an error correcting/detecting code is added to the data stored in the data buffer 11 by the ECC circuit 105 in the HDC 104. The code having a code form of NRZ of the write data which has been inputted from the host computer 101, is converted into a run length limited code such as (1,7) code or (2,7) code that is adapted to be recorded on the magnetic disk at the ENDEC 106. A voltage of the ENDEC 106 is amplified by the R/W AMP 107, and the amplified data is written on the magnetic disk 109 through the head 108. The run length limited code (RLL: Run Length Limited) restricts a continuation of "0" (called "run") which are present between "1" and "1" in a data series. The first numeral in the parenthesis of (1,7) code or (2,7) code indicates a minimum value of the length of the run and the second numeral indicates the maximum value thereof. For instance, in the (1,7) code data, a "0" is always placed succeeding to "1" but there is no continuations of "0" by 8 or more. In this way, the recordable bit density is enhanced in comparison with the density of the magnetization reversal of the disk. The run length limited code signifies a record encoding wherein a data series is produced by conversion that is adapted to a characteristic of a recording and reproducing system.

Further, in reading data from the disk, the magnetic information written on the disk 109 is converted into an electric signal by the head 108, the voltage thereof is amplified by the R/W AMP 107, the analog signal is converted into a digital signal by the read control unit 110, and the run length limited code is converted into the NRZ code by the ENDEC 106. Next, error detection is performed by the ECC circuit 105, the error is corrected when it occurs in the read data, and the corrected data is stored in the data buffer 111. The data stored in the data buffer 111 is transferred to the host computer 101 through the HDC 104, the interface controller 103 and the interface bus 102.

Recently, PRML (Partial Response Maximum Likelihood) has been used as a next generation signal processing technology, as described in Japanese Unexamined Patent Publication No. 190934/1987, "Viterbi Detection of Class IV Partial Response on a Magnetic Recording Channel", IEEE Transaction on Communications, vol. Com-34, No. 5, May, 1986, pps. 454–461, "Signal Processing System PRML Supports a Large Scale Memory Device of Next Generation", Nikkei Electronics, Jan. 17, 1994 (No. 599), pps. 71–97 and the like. The PRML system detects the most likely data series (bit series of the maximum likelihood) among all the occurrable signal series by using the PR (Partial Response) system which performs an effective transfer by allowing inter-code interference of data and by using a decoding method called Viterbi algorithm. There are a number of systems in the PR system depending on what kind of inter-code interference is provided. For instance, PR (1,0;−1) (=PR4) is a system of providing a characteristic of (1D) (1+D) to a recording and reproducing system. In using the PRML system; There are many cases wherein (0,4,4) GCR (Group Coded Recording), or 8–9 conversion code is employed as the run length limited code, as shown in Japanese Examined Patent Publication No. 6699/1991. The (0,4,4) GCR signifies that the run is not smaller than 0 and not larger than 4, and in which the last numeral 4 signifies that the maximum value of the run is 4 in view of every other bit of a data series after encoding. Further, the 8–9 conversion Code is one of codes called block code, which signifies that an 8 bits data is converted into a 9 bits data. The block code converts m bits of an original data series into data having a bits ($m \leqq n$). It maps combinations suitable for the recording and reproducing characteristic in the a bits data from all the combinations of the m bits data.

With the larger capacity and higher density of a magnetic disk, the S/N is deteriorated, as described in "Design Acknowledging Medium Defect in Small Scale HDD Starts. Importance of Error Correction Using ECC Enhances". Nikkei Electronics, Aug. 5, 1991 (No. 533), pps. 141–146. As a remedy for the deterioration of the S/N, a method has been used wherein redundancy bits of the error correcting code are increased and a strong error correcting code is added. As such an error correcting code, for instance, an error correcting code called BCH Code (Bose-Chaudbun-Hocquenghem Code) or Read-Solomon Code has been commercialized. In such an error correcting code, the redundancy bits should be increased in accordance with an increase in the number of error bits to be corrected.

FIG. 27 shows a system in block diagram form wherein an error correcting code is added using the PRML. In FIG. 27, the ECC circuit 105 in the HDC 104 adds an error correcting/detecting code to the write data stored in the data buffer 111, and the ENDEC 106 converts the code having a code form of NRZ of write data which has been inputted from the host computer 101, into the run length limited code that is suitable for recording on the magnetic disk. Further, a convolution encoding called pre-coding is carried out in the signal processing circuit 110 to perform the PRML, by which a regularity is provided to the data. Thereafter, in the R/W AMP 107, the voltage of the pre-coded write data is amplified, by which the writing is performed on the magnetic disk 109 by the head 108. In the PR system, since the inter-code interference is included in the reproduced waveform, it is necessary to remove the inter-code interference to reproduce the original data. Therefore, normally the operation of previously providing an inter-code interference which is inverse to that provided in the recording and reproducing system, is called pre-coding. For instance, an encoding which performs the pre-coding of PR (1.0,−1) (=PR4) to data of the NRZ (Non Return to Zero) system is called interleaved NRZI.

Further, in FIG. 27, in reading data, an electric signal which has been read from the head 108, is amplified by the R/W AMP 107, an error is corrected by ML decoding using the regularity provided to the precoding in the signal processing circuit 110, and the signal is digitized and inputted to the ENDEC 106. The run length limited code is converted into the NRZ code data in the ENDEC 106, successively, an error detecting is performed in the ECC circuit 105, and the error is corrected in case wherein the error has occurred in the read data.

Reference is made to FIG. 29 for an explanation of a behavior of propagation of error occurrence in case wherein, for instance, the PRML of Class 4 is employed as the PRML, a 8–8 convening code is employed as a run length limited code. As shown in FIG. 29, in case wherein an error of 1 bit occurs in reading data that has been recorded on a disk medium, when the data is decoded by the signal processing circuit 110 and is inputted to the ENDEC 106, it becomes an error of 2 bits (on the 8–8 converting code shown in FIG. 29) due to the characteristic of PRML Further, when the 8–8 converting code is converted into the NRZ signal in the ENDEC 106, it is magnified into an error of 2 bytes (on the NRZ code shown in FIG. 29) since it is encoded in the block code. When the length of data is 512 bytes, redundant bits of 48 bits at a minimum is required to correct a continuous 2 bytes in case of the Read-Solomon code.

Further, in the conventional technology, as shown in FIG. 28(d), the error correcting code (ECC) is added only to the write date, and no consideration is given to a case wherein an error occurs in a BYTESYNC region of a synchronization signal, or an identification portion including an area for storing an identification number that is identification information of each sector, or the like. At present, the BYTESYNC is provided with about 1 byte. However, when an error resistance function is to be provided to the NRZ signal in adopting the PRML or the 8–8 converting code, a BYTESYNC region of 5 bytes or more is necessary by adding redundant bits, which very much deteriorates a format efficiency (a ratio of a data capacity as compared with all the memory capacity). Similarly, at present, a CRC (error check code) of 2 bytes is added to the identification portion. However, to provide an error correction capability, a ECC of 4 bytes or more is necessary by adding redundant bits, which very much deteriorates the format efficiency.

Generally, in performing the error correction, the number of the redundant bits of the ECC is necessary to be two times or more of the number of bits to be corrected. The larger the size of error to be corrected, the more it is necessary to increase the redundant bits, which deteriorates the format efficiency.

As stated above, in the conventional technology, writing is performed by converting a data series into the run length limited code after providing the error correcting code thereto in encoding. Conversely, a decoding is performed by the PRML at the signal processing circuit 110 in decoding, and the error correction is performed by the error correcting code after inversely convening the run length limited code. Then, in occurrence of an error, an error occurs which has a regularity specific to a signal processing system that is carried out in the signal processing circuit 110, and the number of bits having the error is increased. Further, in converting it into the NRZ signal in the ENDEC 106, the size of error is further magnified. When the size of error to be corrected is magnified, it is necessary to increase redundant bits.

Further, as mentioned above, in the conventional technology, no consideration has been given to the occurrence of an error in the BYTESYNC region, the identification portion or the like, and it is desirable to provide the error correction capability to these regions.

SUMMARY OF THE INVENTION

It is an object of the present invention for resolving the above problem to provide a recording and reproducing apparatus, a digital signal processing apparatus and a method of correcting an error capable of correcting an error with a fewer number of redundant bits.

It is another object of the present invention to provide a recording and reproducing apparatus and method capable of correcting an error with a fewer number of redundant bits while satisfying a regulation of record encoding.

A recording and reproducing apparatus for recording record or user data to be recorded on a record medium by converting the user data into a predetermined record code, according to the present invention is composed of a record encoding unit for converting the user data into encoded user data of the predetermined record code; an error correcting code generating unit for generating error correcting code data for correcting an error with respect to the encoded user data which has been converted by the record encoding unit; a converting unit for converting the error correcting code data which has been generated by the error correcting code generating unit into encoded correcting code data adapted to the record code; a writing unit for writing a write data including the encoded user data which has been converted by the record encoding unit and the encoded error correcting code data which has been converted by the converting unit such that the encoded error correcting code data is adapted to the record code; a reading unit for reading read data including the encoded user data and the encoded error correcting code data which have been written on the record medium; an inverse converting unit for inversely converting the encoded error correcting code data which has been read by the reading unit into the original error correcting code; an error correcting unit for correcting an error with respect to the encoded user data which has been read by the reading unit based on the original error correcting code data which has been inversely converted by the inverse converting unit with respect to the encoded user data; and a decoding unit for decoding the encoded user data having an error corrected by the error correcting unit to the original user data.

According to the recording and reproducing apparatus of the present invention as mentioned above, the record encoding unit converts the data to be recorded into the encoded user data of the record code in accordance with the characteristic of a recording and reproducing system. As the record code, there are (0,4,4) GCR of the run length limited code, (1,7) code, (2,7) code and the like.

The error correcting code generating unit generates the error correcting code data for correcting an error with respect to the encoded user data which bas been converted into the record code by the record coding unit. As the error correcting code, there are BCH code (Bose-Chaudhuri-Hocquenghem Code), Read-Solomon code and the like.

The converting unit converts the error correcting code data which has been generated by the error correcting code generating unit to adapt to the record code thereby generating the encoded error correcting code data. The conversion may be performed by encoding the error correcting code data by the above-mentioned record encoding unit. Or, in case of using (0,4,4) GCR (Group Coded Recording) as the run length limited code, "1" may be inserted at every 4 bits.

The writing unit writes the encoded user data which has been converted by the record encoding unit and the encoded error correcting code data which has been converted by the converting unit to adapt to the record code, on the record medium.

The reading unit reads the encoded user data and the encoded error correcting code data which have been written on the record medium.

The inverse converting unit inversely converts the encoded error correcting code data which has been read by the reading unit, from the record medium into the original error correcting code data. When the (0,4,4) GCR (Group Coded Recording) is used as the run length limited code, as mentioned above, the inserted code "1" may be deleted at every 4 bits.

The error correcting unit corrects an error of the encoded user data based on the original error correcting code data which has been inversely converted by the inverse converting means, with respect to the encoded user data that has been read by the reading unit.

The decoding unit decodes the encoded user data having an error corrected by the error correcting unit, to the original user data.

According to the recording and reproducing apparatus of this invention, the error can be corrected on the run length limited code by using the error correcting code data. Accordingly, the cumber of bits to be corrected can be restrained to a small value, and the number of redundant bits to be added can be restrained and also the format efficiency can be improved. Further, it is possible to perform a correction in consideration of the characteristic of error concurrence in the Partial Response Maximum Likelihood decoding which has been performed in the earlier stage of operation. Thus, efficient correction can be performed, the number of redundant bits to be added can be minimized and the format efficiency can be improved.

BRIEF DESCRIPTION OF THE DRAWINGS

FIGS. 5(a) and 5(b) are explanatory diagrams of an 8–8 conversion code.

FIG. 6 is an explanatory diagram of an error occurrence pattern in an output of signal processing in accordance with the invention.

FIG. 14 is a more detailed operational sequence block diagram of the on-the-fly error correcting circuit in the example of this invention.

FIG. 23 is a block diagram of an on-the-fly error correcting circuit in accordance with another embodiment of the invention.

DESCRIPTION OF THE PREFERRED EMBODIMENTS

Figure 1:
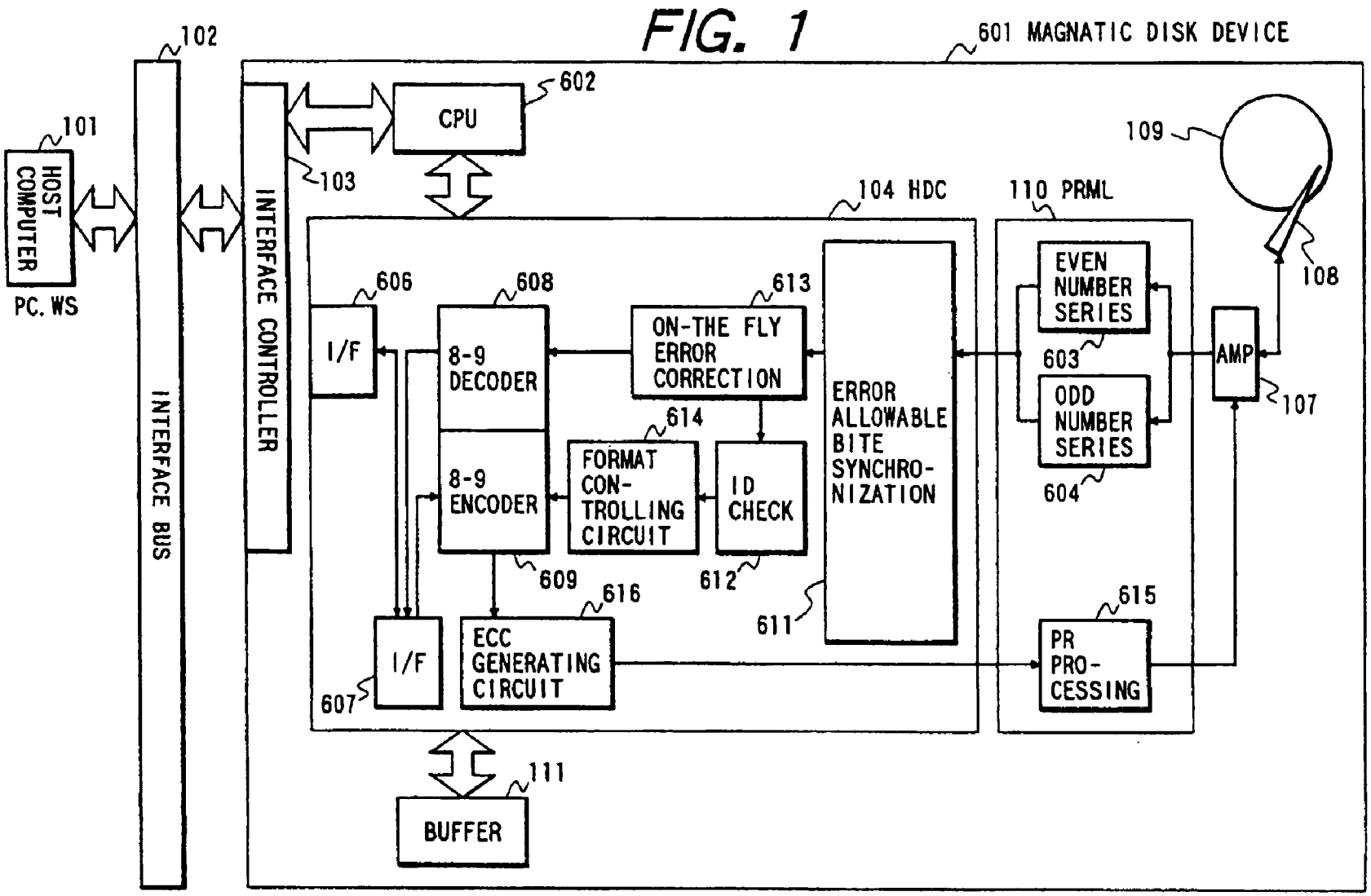
FIG. 1 is a system block diagram embodiment in accordance with the present invention.

Referring now to the drawings wherein like reference numerals are utilized to designate like parts, first an explanation will be given of a system of applying a recording and reproducing apparatus according to the present invention to a magnetic disk device as a first example. In this example, in a magnetic disk device using the run length limited code complying with the characteristic of a magnetic disk, an encoder/decoder of an error correcting code is disposed between an encoder/decoder of the run length limited code and a disk type record medium, and error correction using error correcting code data is performed on the run length limited code. To achieve this operation, redundant bits of the generated error correcting code data satisfies the run length limitation by periodically inserting "1" or "0" to the redundant bits of the error correcting code data which has been generated by an error correcting code generating circuit.

Figure 2:
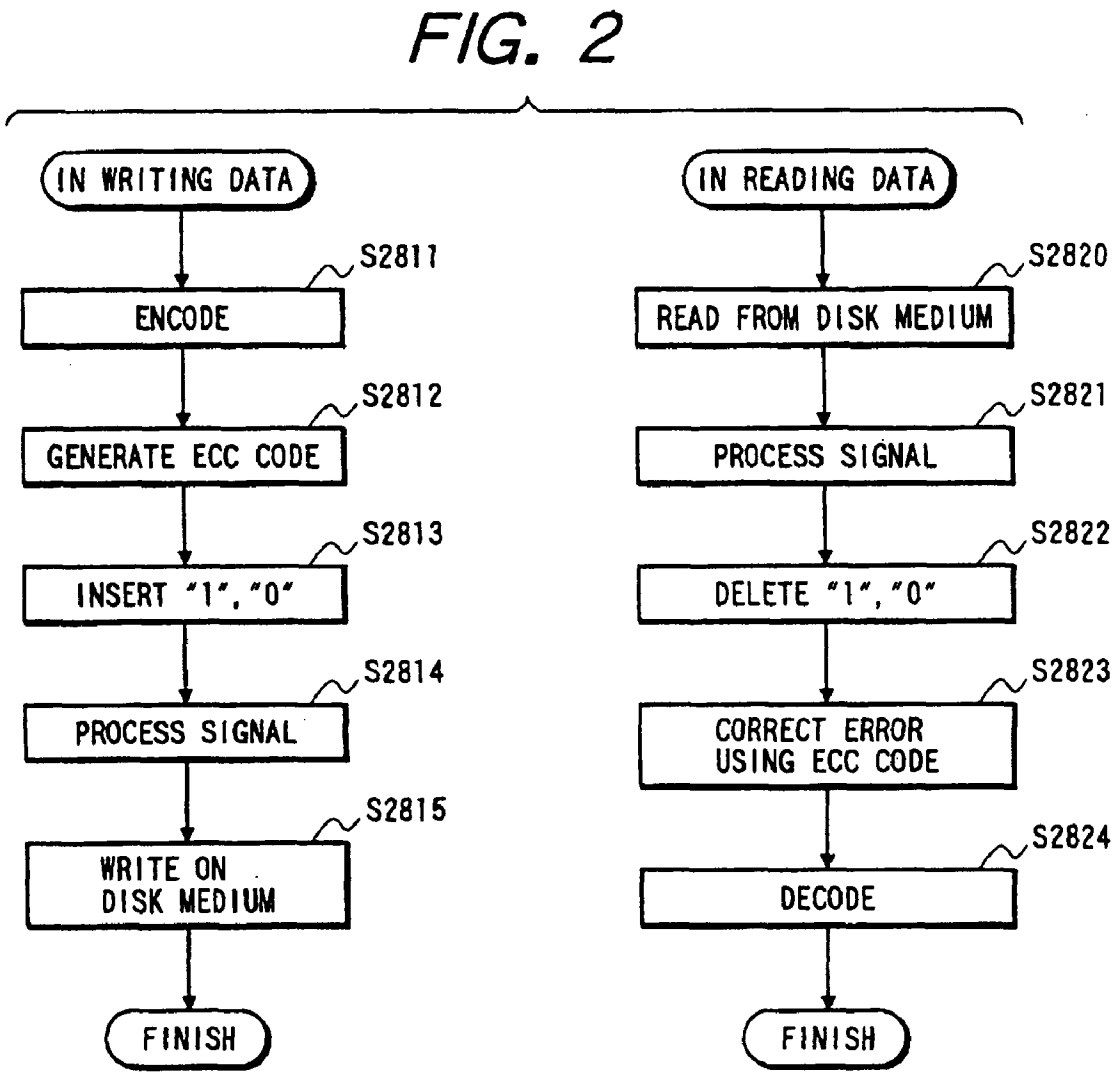
FIGS. 2(a) and 2(b) are flowcharts in accordance with FIG. 1.

FIGS. 2(a) and 2(b) are flowcharts, wherein in writing data as shown in FIG. 2(a), the operation performs encoding in which a write data is converted into a run length limited code (S2811). Next, the operation generates an error correcting code (ECC code) (S2812). Then, the operation inserts "1", "0" to satisfy the run length limitation with respect to the error correcting code (S2813). The operation performs a pre-coding processing with respect to the write data and the error correcting code (S2814). Further, the operation writes data on a disk medium (S2815). In reading data as shown in FIG. 2(b), firstly, the operation reads data from the disk medium (S2820). The operation performs a signal processing of decoding (S2821). The operation deletes "1", "0" which have been inserted in writing, with respect to the error correcting code (S2822). The operation performs the error correction using the error correcting code (S2823). The operation performs decoding from the run length limited code to the NRZ signal (S2824). The operation then transfers the NRZ signal to the host computer.

Figures 3A, 3B, 3C, 3D:
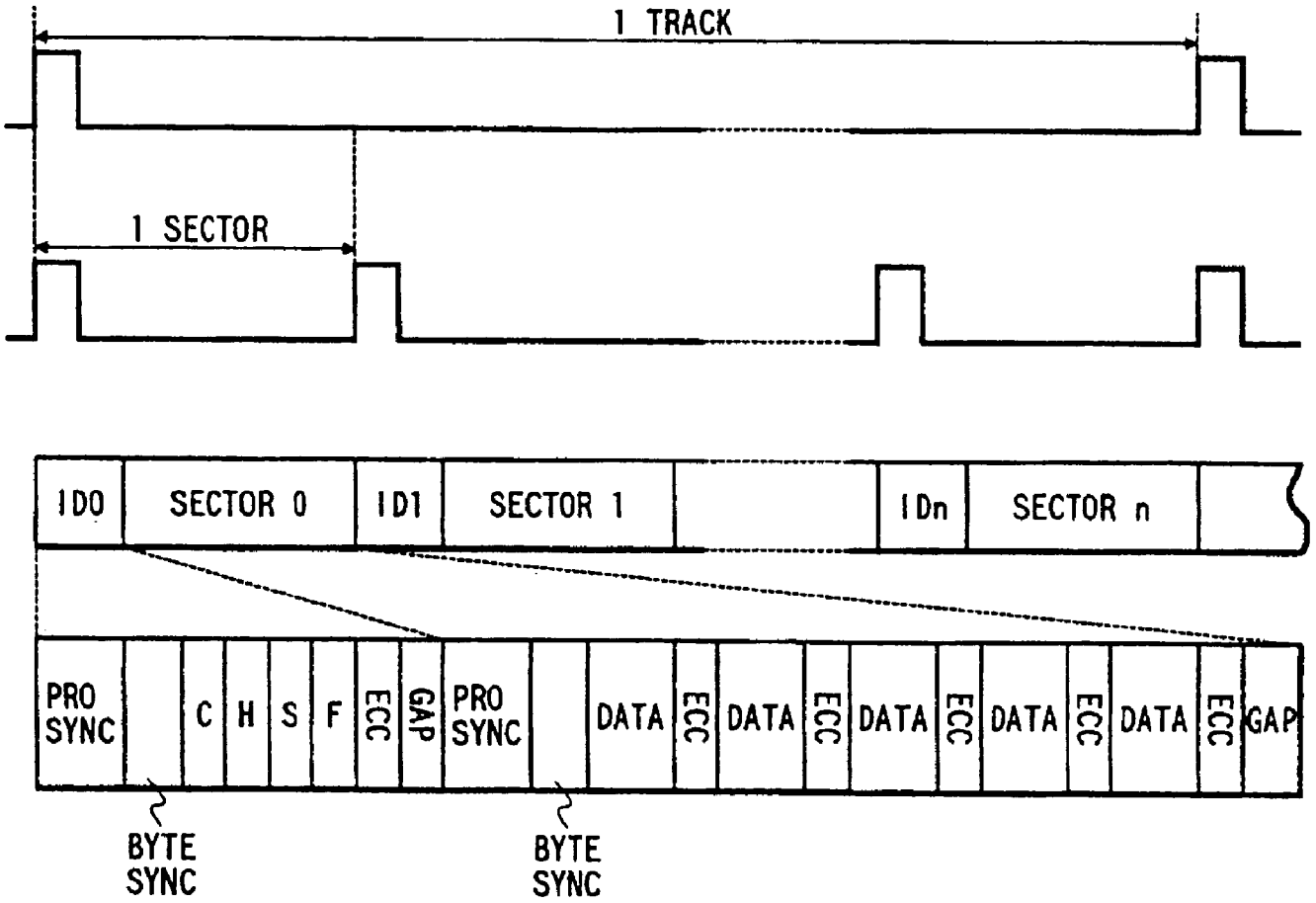
FIGS. 3(a), 3(b), 3(c) and 3(d) are explanatory diagrams showing a record format of a magnetic disk in accordance with the invention.

Further, in this example, another error correcting code is added also to the identification portion to provide an error correction capability. An explanation will be given of a format of the magnetic disk used in the first example referring to FIGS. 3(a)–3(d) which illustrate the format of the magnetic disk utilized. As shown in FIG. 3(c), each track is divided into a plurality of sectors. Each sector is provided with an identification portion and a data portion. As shown in FIG. 3(d), the identification portion is divided into regions of PROSYNC, BYTESYNC, C, H, S, F, ECC, and GAP. Further, the data portion is divided into regions of PROSYNC, BYTESYNC, DATA, ECC and GAP. PROSYNC is a region for recording a signal for synchronization, and BYTESYNC is a region for recording a signal for byte synchronization. Notation C signifies a cylinder number, H signifies a head number, S signifies a sector number, F signifies a flag showing whether the sector is effective or not, ECC signifies a region for recording an error correcting code and GAP signifies an ineffective region of the identification portion.

These DATA, ID and the like are written in a run length limited code called an 8–8 converting code. The 8–8 converting code is also called (0,4,4) GCR, which is a code that is constructed such that 0 bit or more and 4 bits or less "0" are always interposed between "1" and "1", as shown in FIG. 5(a). Further, as shown in FIG. 5(b), the (0,4,4) GCR is a code which is constructed such that 4 bits or less of "0" are always inserted between "1" and "1" in the respective one or two data (an odd number series and an even number series) which is generated by dividing the original series of data bit by bit. As mentioned later, in this example, in order not to destruct the series of the odd number series and the even number series by inserting "l", the portion of series of bits after inserting "1" are rearranged.

Figures 4A, 4B, 4C:
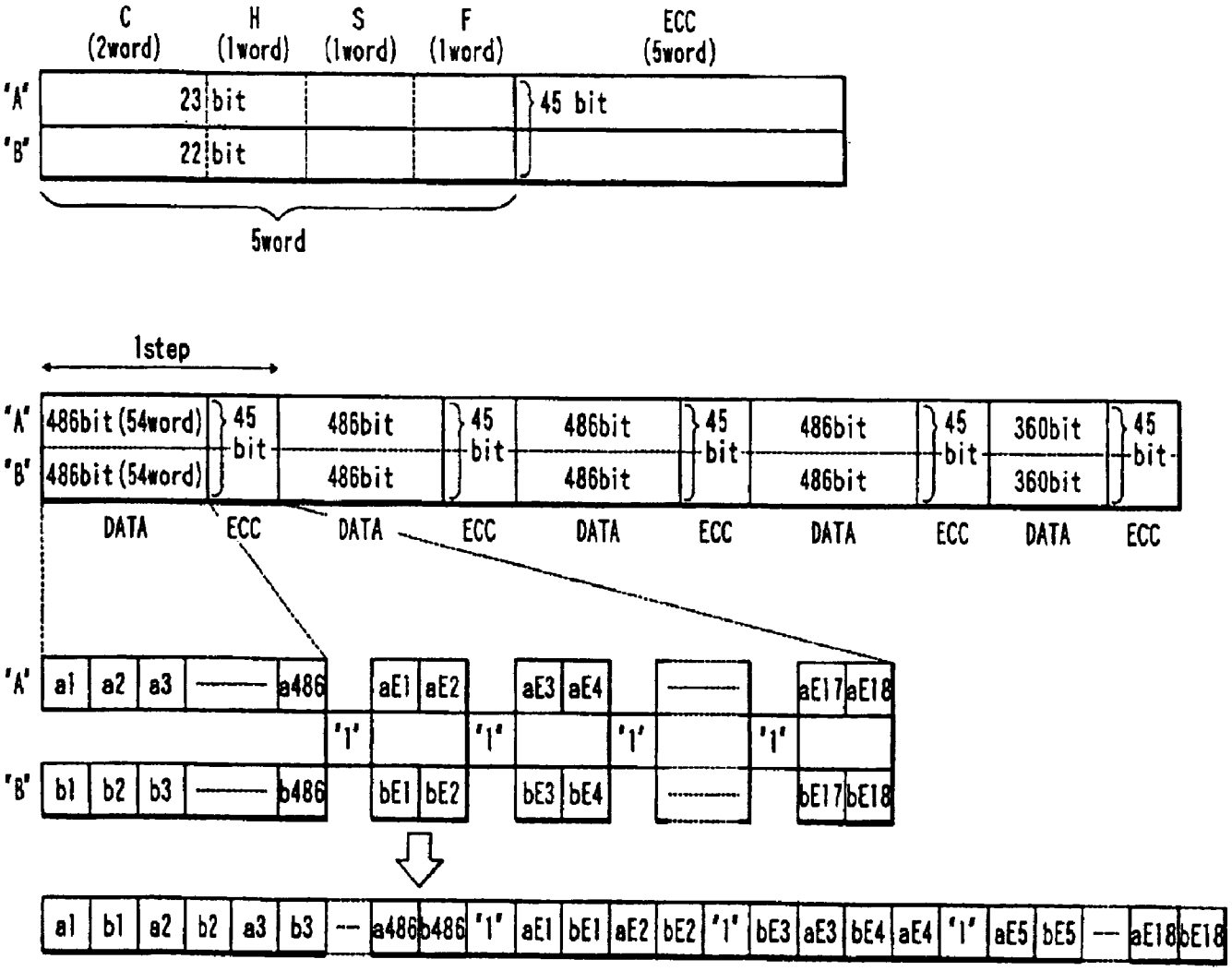
FIGS. 4(a), 4(b) and 4(c) are explanatory diagrams showing a record format of an identification portion and a data portion of the record format in accordance with the invention.

FIGS. 4(a)–4(c) show the portions of ID, DATA and ECC in more detail. FIG. 4(a) shows the identification portion, and FIGS. 4(b) and 4(c) show the DATA portion. Each of the identification portion and the DATA portion is divided into two bits series of an odd number series and an even number series and different error correcting codes are calculated for the respective ones of the odd number series and even number series. AS shown in FIG. 4(b), each bits series of the data portion is divided into code languages of 486 bits (54 words) for each series, and an error correcting code of 23 or 22 bits is added to each code language. AS shown in FIG. 4(c), each error correcting code (aE1 through aE18/bE1 through bE18) is arranged to each series similar to the data, and in this example, "1" is inserted at a rate of once per 4 bits to satisfy the run length limitation of the (0,4,4) GCR. Further, in this example, the order of data of the odd number series "a" and the even number series "b" is rearranged or switched, between before and after the insertion of "1", so that each of the data series of the odd number series "a" and the even number series "b" is processed by the same interleaved series. Further, the bits series of the identification portion is divided into 23 bits and 22 bits. The error in the identification portion can be corrected by adding the error correcting codes of 45 bits as in the data portion.

In this example, a case is adopted as an example in which the generally well-known BCH code is employed as the error correcting code. The BCH code used here, employs a primitive polynomial of 9 degree $x^9+x^4+1$, and the generating function employs $G(x)=(x^9+x^4+1)(X^9+X^6+X^4+X^3+1)=x^{18}+x^{15}+x^{12}+x^{10}+x^8+x^7+x^6+x^3+1$. The calculation used in the error correction is a modal calculation of 2, and "+" signifies an exclusive OR. Hereinafter, an exclusive OR is shown by "+". The BCH code is a code which can correct a random error of 2 bits or less , and which has $\alpha$, $\alpha^2$, $\alpha^3$ and $\alpha^4$ as roots, by putting a root of $x^9+x^4+1=0$ as $\alpha$. Using data as D(x), the code language C(x) is expressed as, $$C(x)=D(x)\cdot x^{18}+D(x)\mathrm{mod}G(x) \quad (1),$$

which is constructed as, $$C(\alpha)=0,\ C(\alpha^2)=0,\ C(\alpha^3)=0,\ C(\alpha^4)=0 \quad (2).$$

FIG. 1 is a block diagram arrangement of a system of the present invention operating in the above-described manner. In FIG. 1, numeral 101 designates a host computer such as a personal computer, a workstation or the like, numeral 102 designates an interface bus for connecting the host computer with the magnetic disk device of this example, and numeral 601 designates the magnetic disk device. The magnetic disk device 601 is composed of an interface controller 103 for connecting the interface bus 102 with the magnetic disk device 601, a CPU 602 for controlling the total operation of the magnetic disk device 601, and a HDC 104 for generating a format of the magnetic disk device 601, correcting an error and controlling the access to the disk, a disk 109 for recording and storing data, a head 108 for writing data to the disk 109, and a AMP 107 for converting a very weak voltage read from the disk 109 by the head 109 into a voltage suitable for signal processing and converting a write signal outputted from a signal processing circuit 110 into a voltage suitable for writing by the head 108, a signal processing circuit 110 for performing a PR processing of class 4 on a write signal outputted from the HDC 104 and outputting it to the AMP 107, further performing a maximum likelihood decoding processing on an analog data outputted from the AMP 107, and converting it into a digital data, and a buffer 111 having a function of temporarily storing a data to be written on the disk 109 and a data road from the host computer.

As shown in FIG. 5(b), the signal processing circuit 110 divides data into an even number series and an odd number series and respectively and independently perform the maximum likelihood decoding by an even number series decoder 603 and an odd number series decoder 604, independently, as shown in FIG. 1. As a characteristic of the PRML processing of class 4, an error pattern that is present on a signal line 605 has a property as shown in FIG. 6. The error bits are present in a pair of two bits in either the odd number series or the even number series. Further, the number of normal bits between the pair of two bits is 4 or less .

In FIG. 1, the HDC 104 is provided with a buffer interface 607 for controlling sending and receiving data to and from the buffer 111, a host interface 606 for controlling sending and receiving data to and from the host computer 101, an 8–8 encoder 609 for encoding data of 8 bits into data of 9 bits, an 8–8 decoder 608 for convening data of 9 bits into data of 8 bits, an on-the-fly error correcting circuit 613 for correcting an error in accordance with the error correcting code, an identification checker 612 for checking an identification that is an identifying information of each sector, in reading, or in writing, an error allowable byte synchronization circuit 611 for establishing a byte synchronization, a format controlling circuit 614 for performing the total control of the HDC 104 and an ECC generating circuit 616 for generating the error correcting code.

Figure 7:
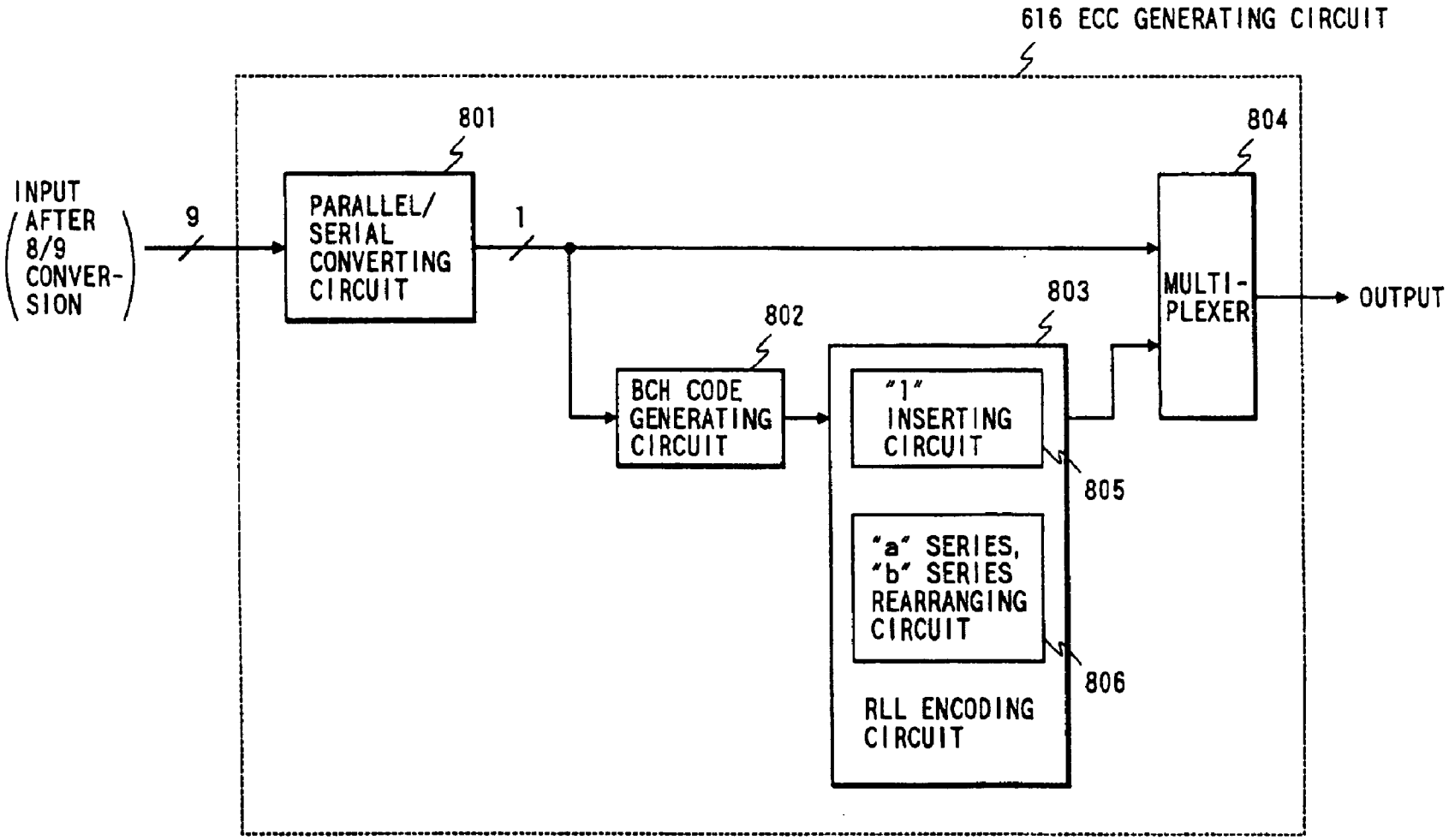
FIG. 7 is a block diagram of an ECC circuit in accordance with the invention.

FIG. 7 shows a block diagram of the ECC generating circuit 616 shown in FIG. 1. In FIG. 7, the ECC generating circuit is provided with a parallel/serial converting circuit 801 for converting parallel data series of 9 bits received from the 8–8 encoding circuit 609 in FIG. 1 into a series of serial data series of 1 bit, a BCH code generating circuit 802, a RLL encoding circuit 803 for adapting to the run length limited code and a multiplexer 804 for switching the error correcting code generated by the BCH code generating circuit 802 to the serial data from the parallel/serial converting circuit 801 and vice versa, in order to add the error correcting code generated by the BCH code generating circuit 802 to the encoded dais. The RLL encoding circuit 803 is provided with a "1" inserting circuit 805 for inserting "1" at every 4 bits, and an "a" series, "b" series rearranging circuit 806 for rearranging the order of data of the odd number series "a" and the even number series "b". The multiplexer 804 switches the serial data (8–8 converted write data) from the parallel/serial convening circuit 801 into the error correcting code and vice versa in order to generate the format as shown by FIG. 4, by which the error correcting code is added to the write data.

Figure 8:
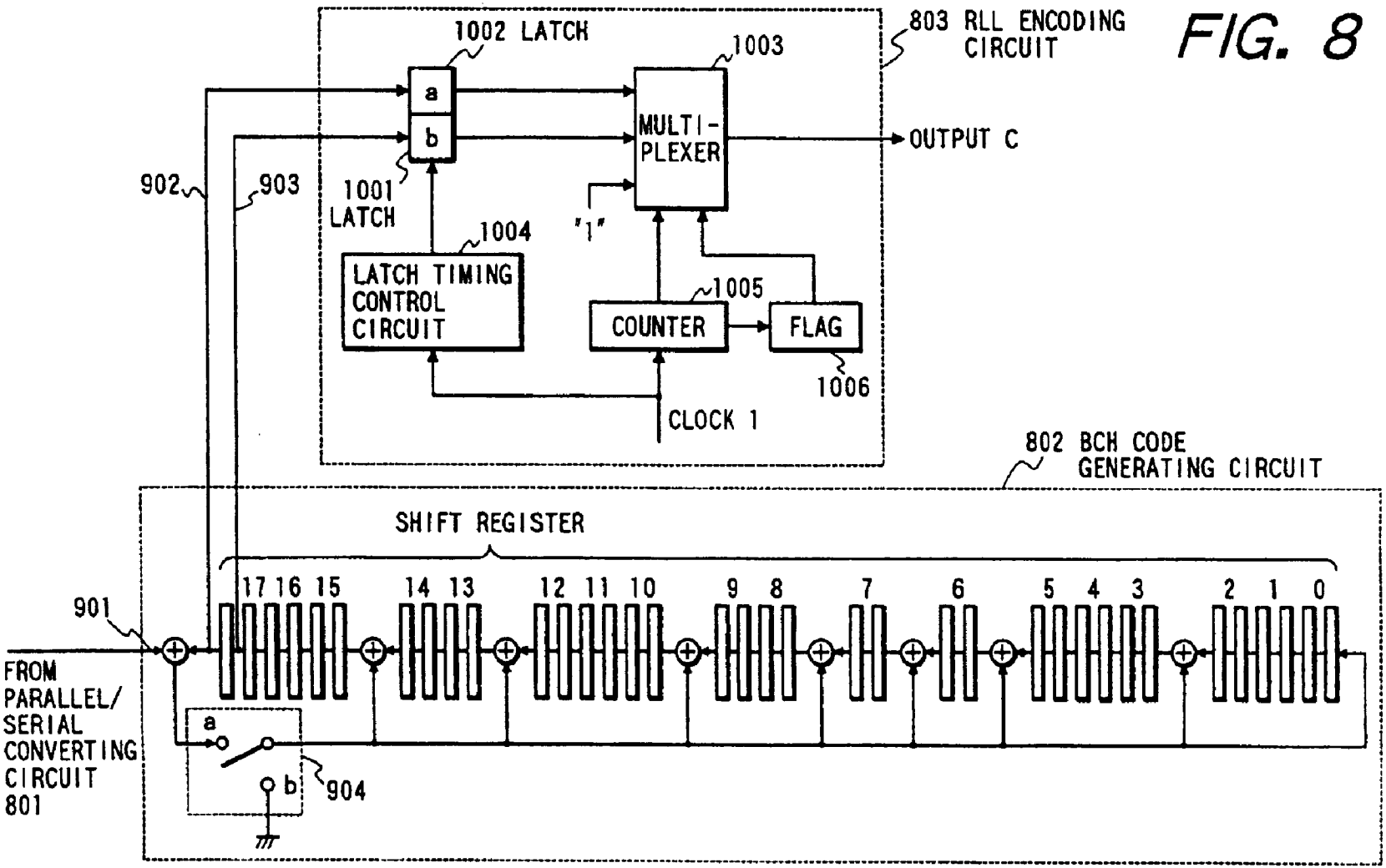
FIG. 8 is a block diagram of a RLL encoding circuit and a BCH code generating circuit in accordance with the invention.

FIG. 8 shows a block diagram of the BCH code generating circuit 802 and the RLL encoding circuit 803 which are shown in FIG. 7. As shown in FIG. 8, the BCH code generating circuit 802 is provided with a shift register of 36 bits, 8 exclusive OR circuits and a switch 904. The RLL encoding circuit 803 is provided with latches of 2 bits 1001 and 1002, a multiplexer circuit 1003, a latch timing control circuit 1004, and a counter 1005 for counting and circulating a clock 1 from 1 through 5, and a flag 1006, and is provided with functions of the "1" inserting circuit 805 and the "a" series, "b" series rearranging circuit 806. The BCH code generating circuit 802 generates error correcting codes of 18 bits for the respective one of the "a" series and "b" series.

The RILL encoding circuit 803 may be replaced by a circuit so far as it converts the error correcting code to adapt to the run length limited code, and may use the 8–9 encoder 609 which converts data of 8 bits into data of 9 bits and encodes it.

Figure 9:
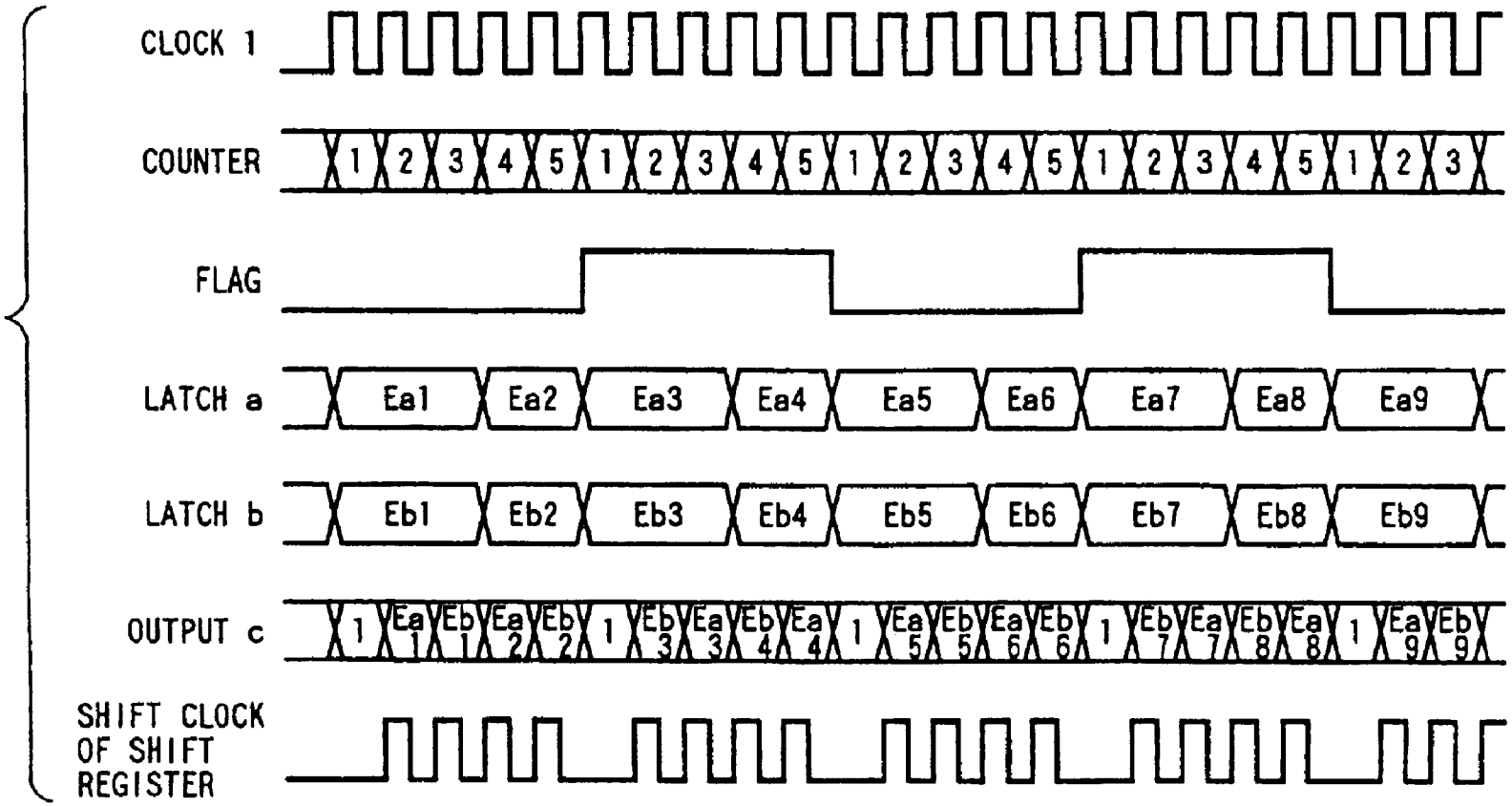
FIG. 9 illustrates timing charts of the RLL encoding circuit in accordance with the invention.

The operation of the ECC generating circuit 616 will be described with reference 10 FIG. 8 and FIG. 9, wherein FIG. 9 illustrates timing charts of the RLL encoding circuit. In FIG. 8, when one block of serial data from the parallel/serial converting circuit 801 is inputted from an input data line 901, the BCH code generating circuit 802 sets the switch 904 to the terminal a. The BCH code generating circuit 802 is a circuit wherein the input data is classified into the a series and the b series bit by bit, each of which is divided by the generating function of $G(x)={}^{18}+x^{15}+x^{12}+X^{10}+X^{8}+X^{7}+X^{6}+X^{3}+1$ and leaves the remainder to the shift register when the inputting of data is finished, and the remainder is the error correcting code. When the inputting of data is finished, the BCH code generating circuit 802 sets the switch 904 to the terminal b, and outputs the content of the shift register in which the error correcting code of the odd number series is stored, to a signal line 902 and outputs the content of the shift register in which the error correcting code of the even number series is stored, to a signal line 900. Thereby, the error correcting code (aE1 through aE18/E1 through bE18 shown in FIG. 4(c)) is generated, by which the BCH code can be generated.

At this instance, the RLL encoding circuit 803 operates as shown in FIG. 9. The error correcting code which is outputted via the signal line 902 and the signal line 903, is latched by the latches 1001 and 1002 in accordance with the control signal of the latch timing control circuit 1004, and "1" is inserted when the count value of the counter 1005 is 1. The flag 1006 is used for rearranging the order of data of the odd number series "a" and the even number series "b", and the flag is set/reset when the value of the counter 1005 becomes 1 from 5, such that the flag 1006 is set when the error correcting code of the even number series "b" is outputted prior to the error correcting code of the odd number series "a" after inserting "1". The multiplexer circuit 1003 selects "1" when the count value of the counter 1005 is 1, selects firstly the odd number series "a" which has been latched in the latch 1001, in case wherein the flag 1006 is not set when the count value of the counter 1005 is 2 through 5, and next, selects the even number series "b" which has been latched in the latch 1002, thereby alternately outputting the odd number series and the even number series. When the flag 1006 is set, the multiplexer circuit 1003 selects the even number series "b" which has been latched in the latch 1002, and next, selects the odd number series "a" which has been latched in the latch 1001.

In this way, in the BCH code generating circuit 802 and the RLL encoding circuit 803, the error correcting code is generated and "1" is inserted such that the odd number series and the even number series are alternately outputted so that the series are not destructed, and such that the run length limitation is maintained. The error correcting code is added to the write data by the multiplexer 804 that is outputted to the PRML 110 shown in FIG. 1. Thereby, the error correcting code (aE1 through aE18/bE1 through bE18) of 18 bits is generated for each of the "a" series and "b" series, "1" of 9 bits are inserted then into, and a total of 45 bits are stored in the ECC portion. Further, the error correcting code is generated to each of data in the data portion and the identification portion. The error correcting code in the identification portion is generated and added to the identification portion in formatting the magnetic disk, and is recorded on the magnetic disk after the pre-coding.

The operation of the on-the-fly error correcting circuit 613 for correcting an error in decoding will be described with reference to FIGS. 10, 11, 12, 114 and 15.

Figure 10:
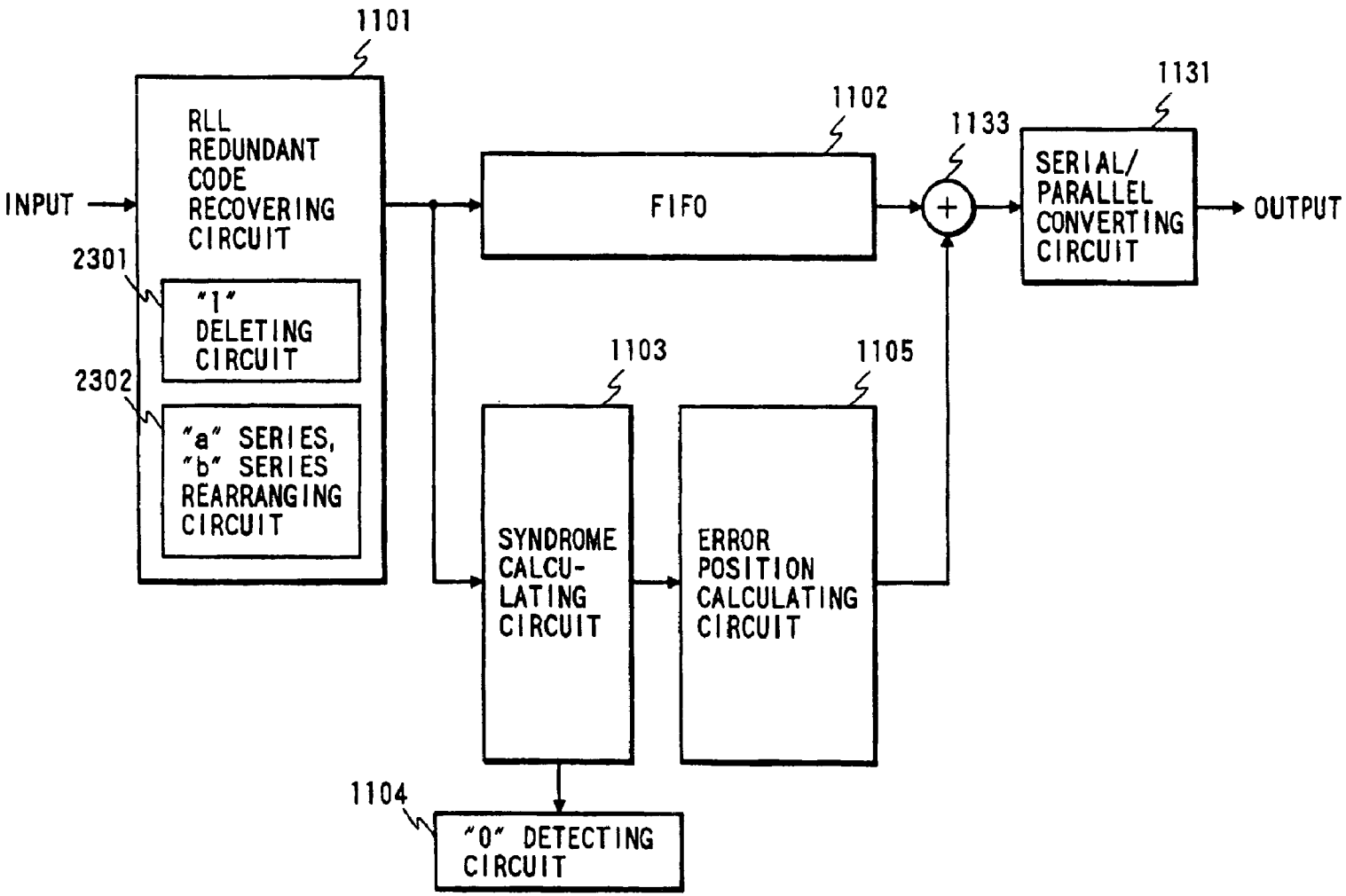
FIG. 10 is a block diagram of an on-the-fly error correcting circuit in accordance with the invention.

FIG. 10 shows a block diagram of the on-the-fly error correcting circuit 613. As shown in FIG. 10, the on-the-fly error correcting circuit 613 is provided with a RLL redundant code recovering circuit 1101 for rearranging an even number series and an odd number series by deleting an inserted "1", a FIFO 1102, a syndrome calculating circuit 1103 for calculating a state of an error which has occurred in a code language, an "0" detecting circuit 1104 for detecting "0", and an error position calculating circuit 1105 for detecting an error position based on a value which has been calculated by the syndrome calculating circuit 1103 Further, the RLL redundant code recovering circuit 1101 is provided with a "1" deleting circuit for deleting the inserted "1" and an "a" series, "b" series rearranging circuit 2302 for rearranging the even number series and the odd number series.

In FIG. 10, the RLL redundant code recovering circuit 1001 deletes "1" which has been inserted at the "1" inserting circuit in encoding, and rearranges the even number series and the odd number series. Thereafter, the syndrome calculating circuit 1103 calculates a state of an error which bas occurred in the code language, and the error position calculating circuit 1105 defects an error position based on a value which has been calculated by the syndrome calculating circuit 1103, as mentioned later. Thereafter, the error is corrected based on the data stored in the FIFO 1102 and the error position which has been defected by the error position calculating circuit 1105, and a serial data is converted into a parallel data that is outputted to the 8–8 decoder, in the serial/parallel convening circuit 1131.

Figure 11:
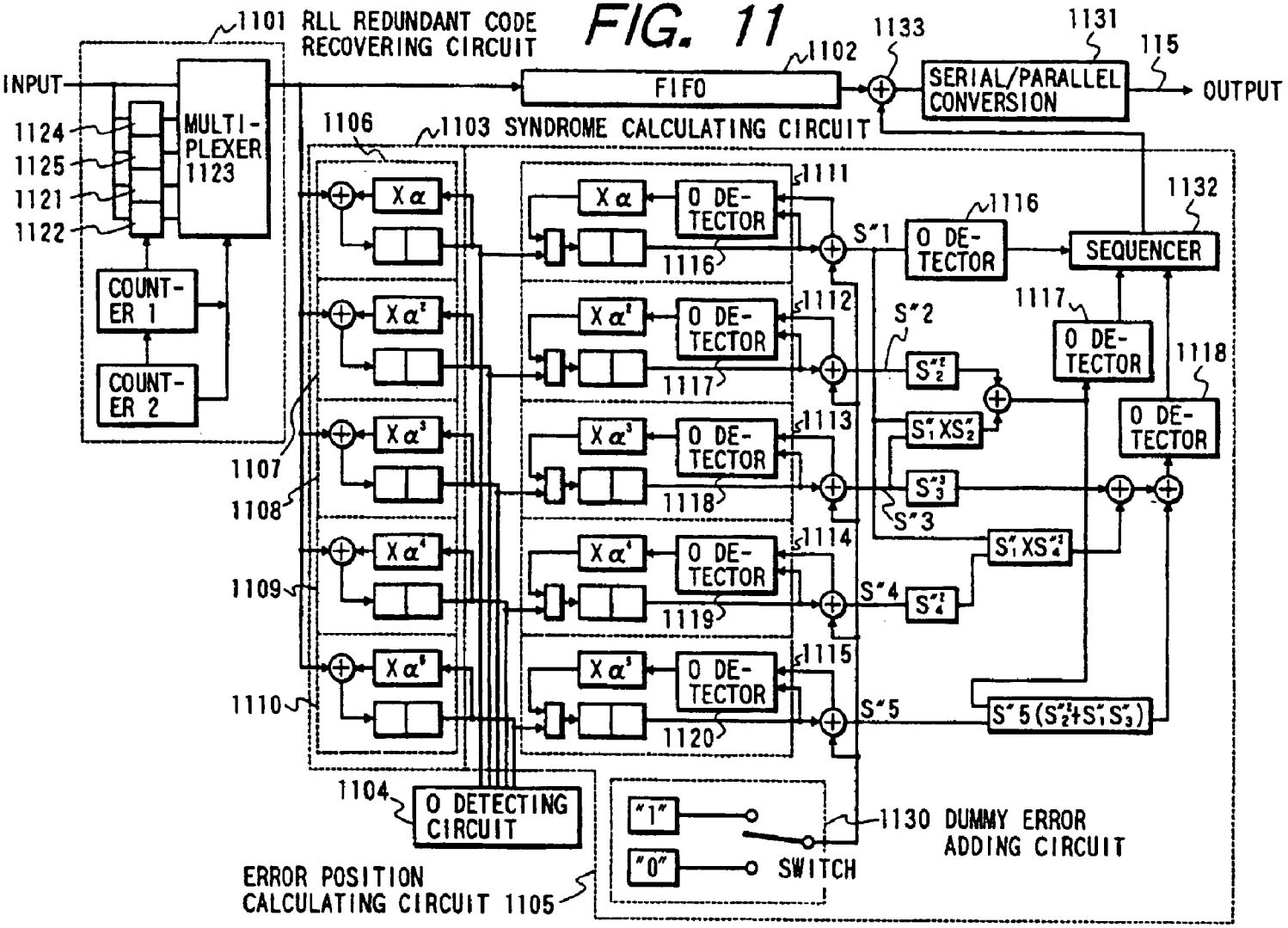
FIG. 11 is a detailed block diagram of the on-the-fly error correcting circuit in accordance with the invention.
Figure 12:
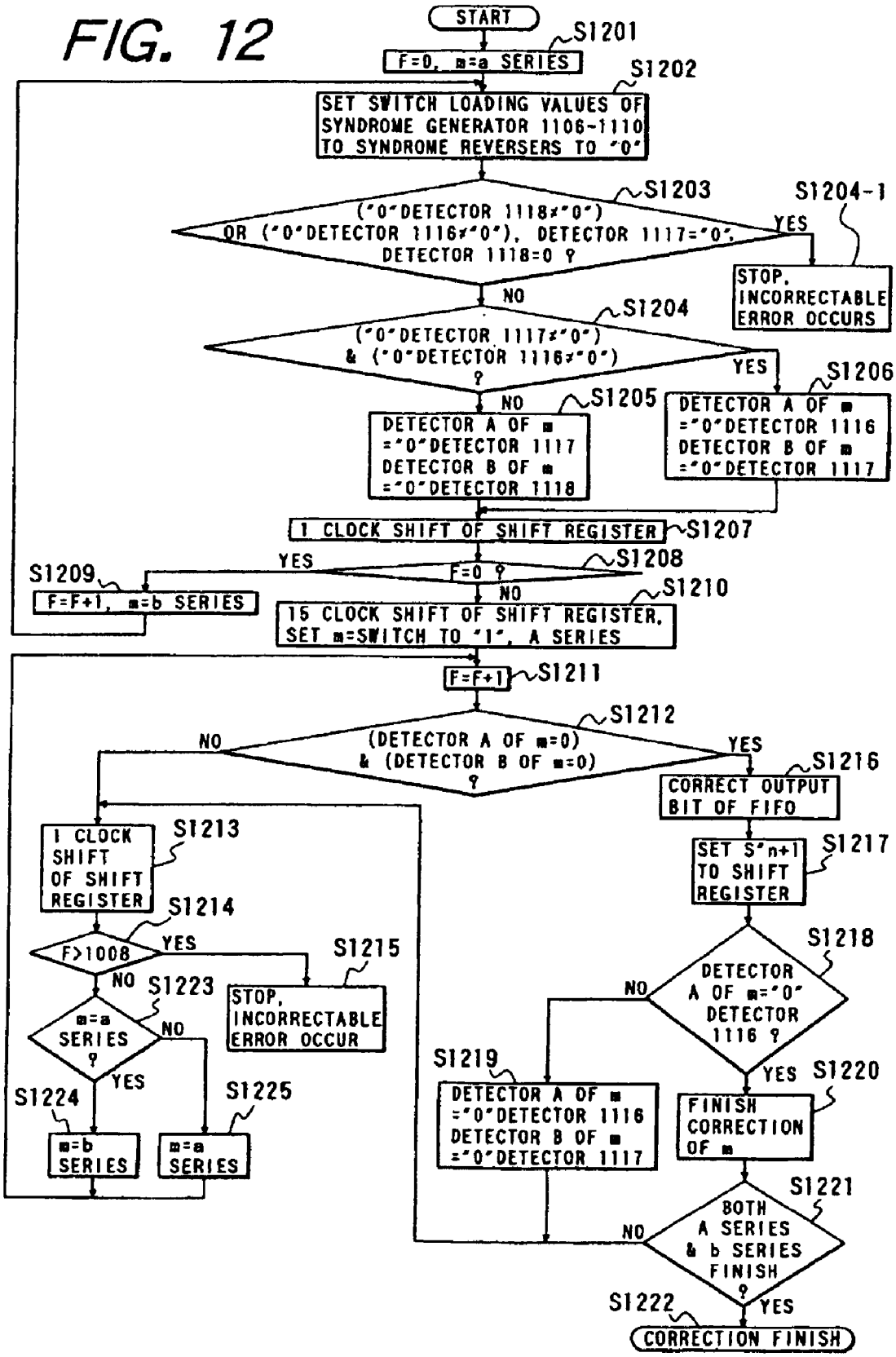
FIG. 12 is a flowchart of the on-the-fly error correcting circuit in accordance with the invention.
Figure 13:
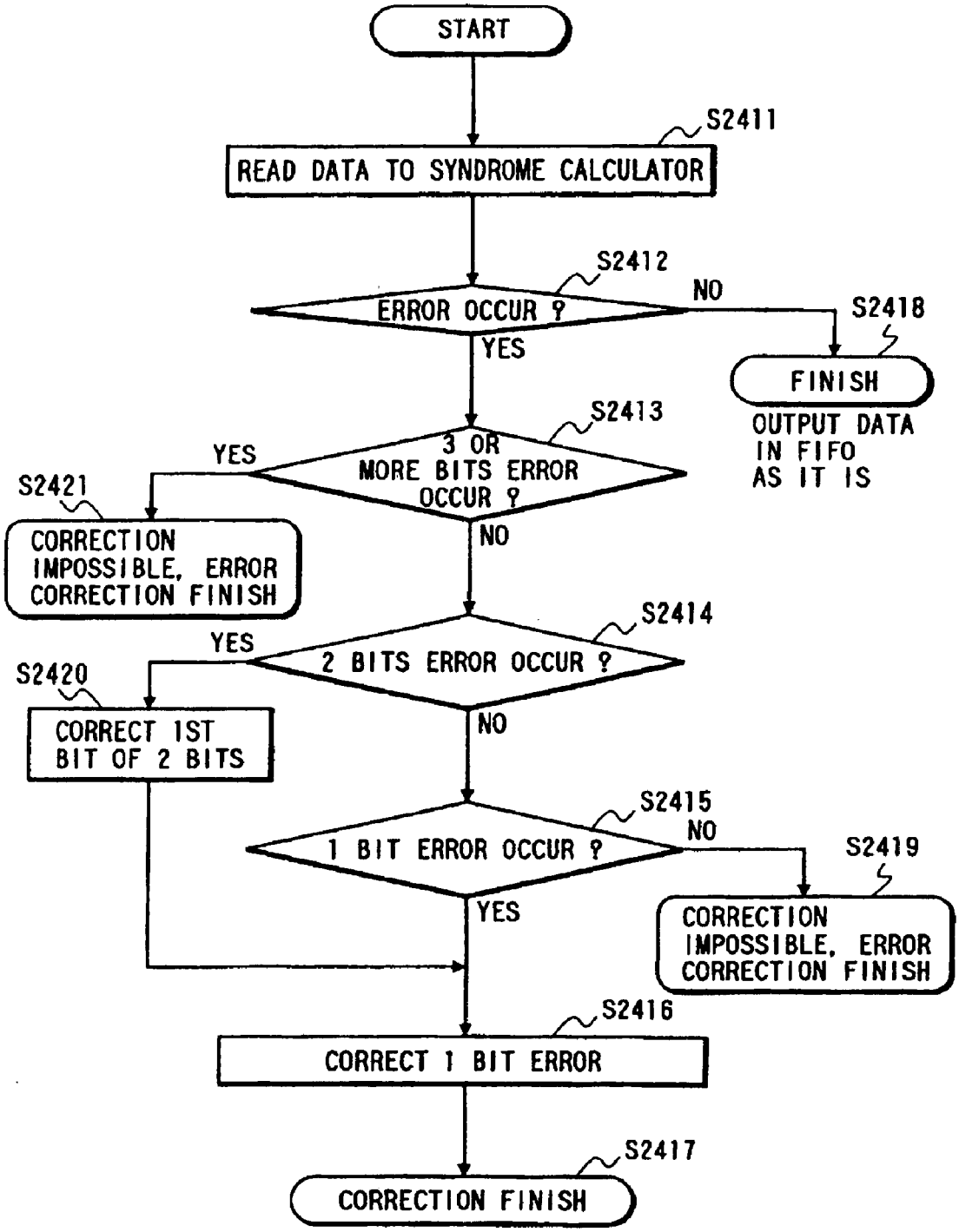
FIG. 13 is an operational sequence block diagram of the on-the-fly error correcting circuit in accordance with the invention.

FIG. 11 is a circuit block diagram showing the on-the-fly error correcting circuit 613 in more detail. FIG. 12 is a flowchart showing the processing or a sequencer in the on-the-fly error correcting circuit 613. FIG. 13 shows an outline of an operational sequence of the syndrome calculating circuit 1103, the error position calculating circuit 1105 and the "0" detecting circuit 1104 in the on-the-fly error correcting circuit. FIG. 14 shows an operational sequence of the syndrome calculating circuit 1103, the error position calculating circuit 1105 and the "0" detecting circuit 1104 in the on-the-fly error correcting circuit 613. Further, FIG. 15 illustrates operation timing charts of the on-the-fly error correcting circuit 613.

In FIG. 11, the RLL redundant code recovering circuit 1101 is provided with latches 1120, 1125, 1121 and 1122, a counter 1 for counting the number of data, a counter 2 for counting and circulating 1 through 10, and a multiplexer 1123.

Figure 15:
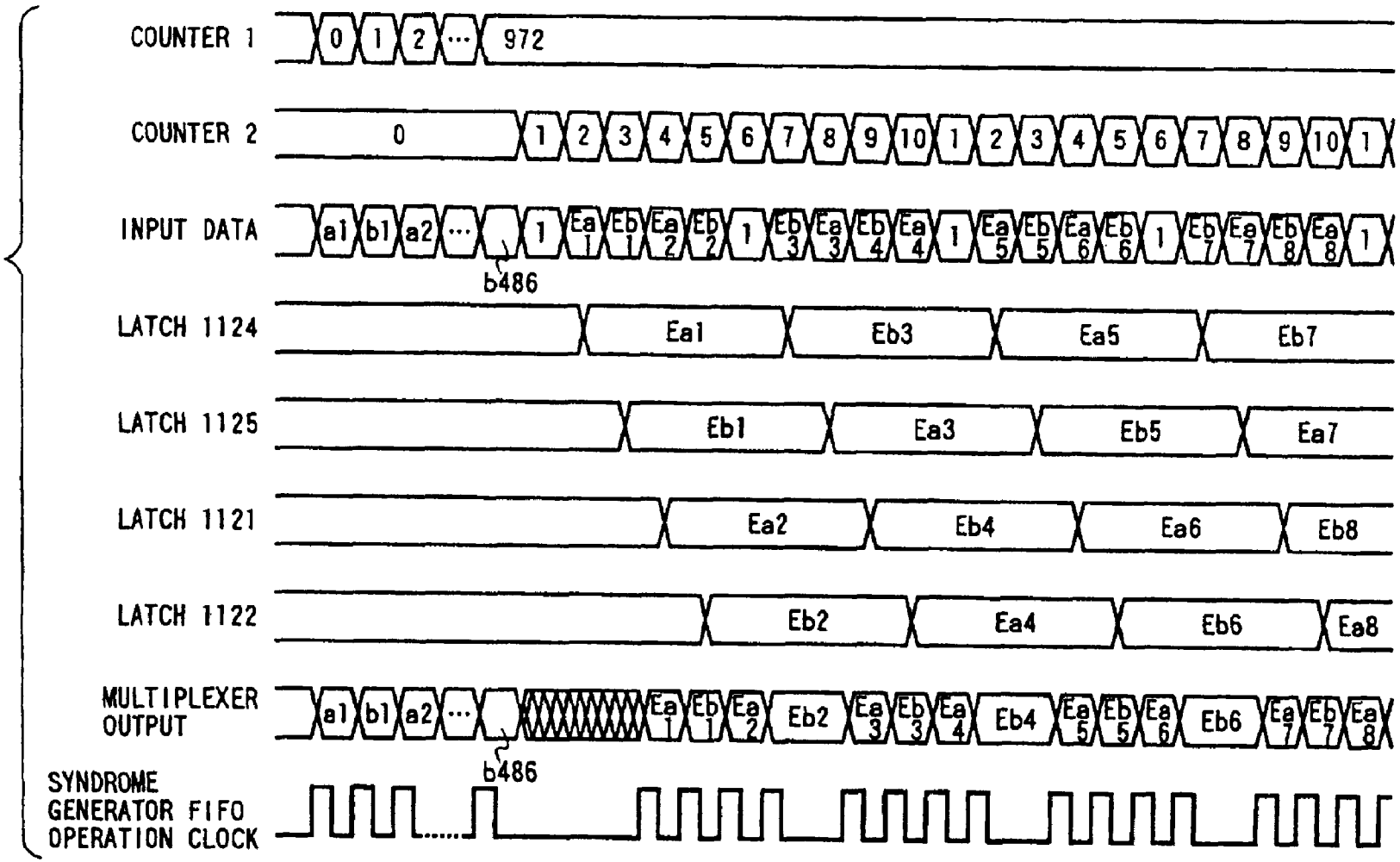
FIG. 15 illustrates timing charts of a RLL encoding circuit in accordance with the invention.

As shown in FIG. 15, in the RLL redundant code recovering circuit 1101 of FIG. 11, during the inputting of data other than the error correcting code, the number of data is counted by the counter 1 and the input data is outputted as it is as the output of the multiplexer until 962th bit. Next, during the inputting of the error correcting code and the error correcting code including "1", when the count value of the counter 2 is 1 or 5, "1" which is inputted at every 4 bits interval is deleted and the "a" series data and the "b" series data are rearranged such that the "a" series data is always prior to the "b" series data, by switching the output of the multiplexer 1123. In this way, the inserted "1" is deleted, and the odd number series and the even number series are arranged in turn.

In FIG. 11, the syndrome calculating circuit 1103 performs a general syndrome calculation in the BCH code, as shown in FIG. 13 and 14. Defining code language as C(x), calculation units 1106 through 1110 respectively calculate $S1=C(\alpha)$, $S2=C(\alpha^2)$, $S3=C(\alpha^3)$, $S4=C(\alpha^4)$, $S5=C(\alpha^5)$. When there is no error in the code language C(x), S1=S2=S3=S4=0. A "0" detector 1104 checks whether S1 through s4 are 0, and determines that no error occurs when S1=S2=S3=S4=0 and the data stored in FIFO 1101 is outputted as it is to an output line 115. When at least one of S1, S2, S3 and S4 is not 0, the error position calculating circuit 1105 is operated to thereby perform the error correction.

When an error of 1 bit occurs in the code language C(x), the following relationship is established.

$$S1\neq 0,\ s1\cdot S3+S2^2=0,$$

$$S3^3+S1\cdot S4^2+S2^2\cdot S5+S1\cdot S3\cdot S5=0$$

When an error of 2 bits occurs in the code language C(x), the following relationship is established.

$$S1\cdot S3+S2^2\neq 0,$$

$$S3^3+S1\cdot S4^2+S2^2\cdot S5+S1\cdot S3\cdot S5=0$$

When an error of 3 bits occurs in the code language C(x), the following relationship is established.

$$S3^3+S1\cdot S4^2+S2^2\cdot S5+S1\cdot S3\cdot S5\neq 0$$

The error position calculating circuit 1105 performs the correction by using the above property as shown in FIG. 13 and 14. The operational flow of the error position calculating circuit 1105 is shown in FIG. 12.

In FIGS. 13 and 14, the operation reads data to the syndrome calculating circuit 1103 (S2411, 12511). After reading data (S2512), the operation determines whether the syndromes S1, through S4 are 0 or not (S2513), through which the operation determines whether an error occurs or not (S2412). When an error occurs, the operation checks whether an error of 3 bits or more occurs or not (S2413, S2515), whether an error of 2 bits occurs or not (S2414, 52516) and whether an error of 1 bit occurs or not (S2415, S2517), respectively. When an error of 3 bits or more occurs, the operation finishes the error correcting processing as the error can not be corrected (S2421, S2518). When an error of 2 bits occurs, the operation corrects a first 1 bit (S2420) and thereafter corrects the residual bit (S2416, S2524 through S2533). When an error of 1 bit occurs, the operation corrects the bit (S2416, S2519 through S2523).

The error correction method is performed in accordance with a flowchart shown in FIG. 12. In FIG. 12, first, the operation calculates the syndrome of the "a" series (F=0, m=a series), and performs a similar calculation with respect to the "b" series (m=b series) (S1201). First, the operation sets a switch of a dummy error adding circuit 1130 to the side of "0", and loads a value of the first stage of the syndrome calculating circuits 1106 through 1110, to the first stage of syndrome circulators 1111 through 1115 (S1202). A "0" detector 1116 detects "0" of S1. A "0" detector 1117 detects "0" of $S1\cdot S2+S2^2$. A "0" detector 1118 detects "0" of $S3^3+S1\cdot S4^2+S2^2\cdot S5+S1\cdot S3\cdot S5$. When the "0" detectors 1116,1117 and 1118 detect 0, or when the "0" detector 1118 detects 1, the operation determines that the error can not be corrected (S1203, S1204-1).

Figure 16:
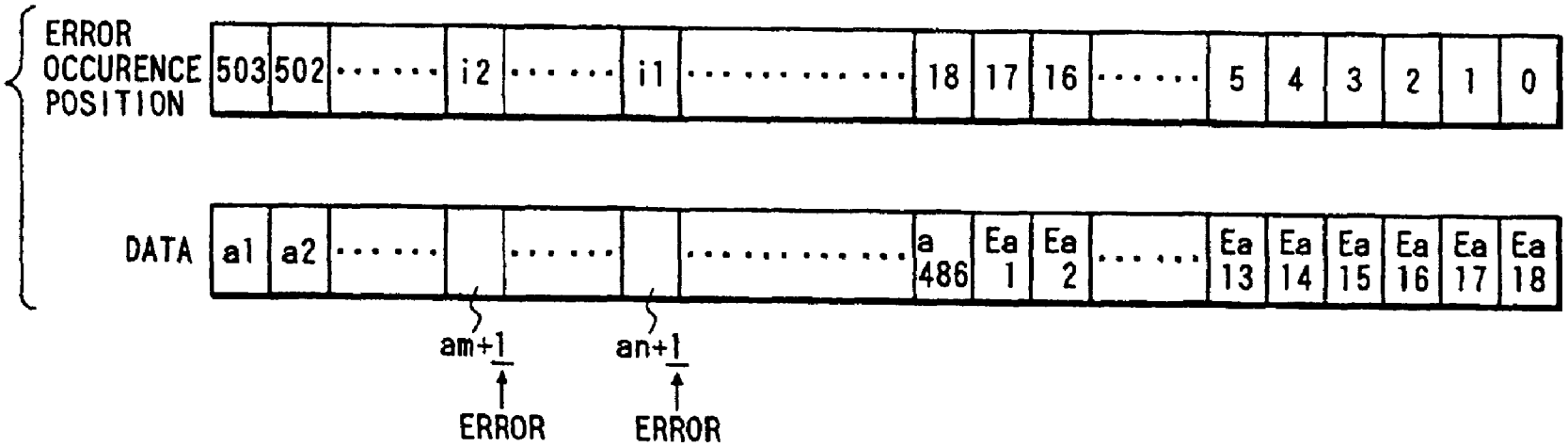
FIG. 16 is an explanatory diagram showing an error occurrence pattern example in accordance with the invention.

Assuming an example in which an error of 2 bits occurs in the data series of a as shown in FIG. 16. That is, assuming that original data $a_m$ and $a_n$ at positions i1 and i2, are respectively added with an error value "1", and become $a_m+1$ and $a_n+1$. In this case, the syndrome values S1, S2, S3, S4 and S5 are expressed as follows.

[Equation 1]

$$S1 = a^{i1} + a^{i2}$$
$$S2 = a^{2i1} + a^{2i2}$$
$$S3 = a^{3i1} + a^{3i2}$$
$$S4 = a^{4i1} + a^{4i2}$$
$$S5 = a^{5i1} + a^{5i2}$$

At this instance, the following relationship is established.

$$S1 \cdot S3 + S2^2 \neq 0$$
(the output of the "0" detector 1117)
$$S3^3 + S1 \cdot S4^2 + S2^2 \cdot S5 + S1 \cdot S3 \cdot S5 = 0$$
(the output of the "0" detector 1118)

Accordingly, the above case is not that the "0" detector 1117≠0, and the "0" detector 1116=0 (S1204), and therefore, the operation defines that detector A="0" detector 1117, and detector B="0" detector 1118 and performs the checking thereafter (S1205).

The operation performs similarly with respect to the "b" series (S1208, S1209). In this case, there is no error in the "b" series.

Next, the operation shifts the shift register by 15 times (S1210). The operation processes the data of the "a" series once per every two times, and therefore, S1, through S5 are multiplied by $\alpha^8$, $\alpha^{16}$, $\alpha^{24}$, $\alpha^{32}$ and $\alpha^{40}$, respectively, and the values of S'1, S'2, S'3, S'4, and S'5 which are inputted to the first stage of the syndrome circulators 1111 through 1115, are as follows.

[Equation 2]

$$S'1 = a^{i1+8} + a^{i2+8}$$
$$S'2 = a^{2(i1+8)} + a^{2(i2+8)}$$
$$S'3 = a^{3(i1+8)} + a^{3(i2+8)}$$
$$S'4 = a^{4(i1+8)} + a^{4(i2+8)}$$
$$S'5 = a^{5(i1+8)} + a^{5(i2+8)}$$

At this instance, the operation sets the switch to the side of "1" (S1210), and using S"1=S'1+1, S"2=S'2+1, S"3=S'3+1, S"4=S'4+1 and S"5=S'5+1, the operation checks the value of the detector A, $S''2^2+S''1 \cdot S''3$ and the value of the detector B, $S''3^3+S''1 \cdot S''4^2+S''2^2 \cdot S''5+S''1 \cdot S''3 \cdot S''5$ (S1212). At this moment, the operation controls the output of the FIFO such that a first bit a1 of the a series is outputted. In the above example, the value of the detector A, or the "0" defector 1117, is not 0. Further, the value of the detector B, or the "0" detector 1118, is not 0.

Further, the operation shifts the register by 2(503-i2) times (S1213, S1214, S1223, S1224 and S1225). Then, the values of S'1, S'2, S'3, S'4 and S'5 are as follows.

[Equation 3]

$$S'1 = a^{i1+8+500-i2} + a^{i2+8+500-i2} + a^{i1+511-i2} + 1$$
$$S'2 = a^{2(i1+8+500-i2)} + a^{2(i2+8+500-i2)} + a^{2(i1+511-i2)} + 1$$
$$S'3 = a^{3(i1+8+500-i2)} + a^{3(i2+8+500-i2)} + a^{3(i1+511-i2)} + 1$$
$$S'4 = a^{4(i1+8+500-i2)} + a^{4(i2+8+500-i2)} + a^{4(i1+511-i2)} + 1$$
$$S'5 = a^{5(i1+8+500-i2)} + a^{5(i2+8+500-i2)} + a^{5(i1+511-i2)} + 1$$

At this moment, the operation sets the switch to the side of "1", and using S"1=S'1+1, S"2=S'2+1, S"3=S'3+1, S"4=S'4+1, and S"=S'5+1, the checks the value of the detector A, $S''2^2+S''1 \cdot S''3$ and the value of the detector B. $S''3^3+S''1 \cdot S''4^2+S''2^2 \cdot S''5+S''1 \cdot S''3 \cdot S''5$ (S1212). At this instance, the value of the detector A, or the "0" detector 1117 and the value of the detector B, or the "0" detector 1118 are 0. Accordingly, the operation corrects the output of the FIFO $a_m+1$ to $a_m+1+1=a_m$ and outputs it (S1216). Next, the operation controls the multiplexers 1116 through 1120, and stores S"1, S"2, S"3, S"4 and S"5 to the syndrome circulators 1111 through 1115 (S1217). Therefore, the following values are stored in the syndrome circulators 1111 through 1115.

[Equation 4]

$$S''1 = a^{i1+511-i2}$$
$$S''2 = a^{2(i1+511-i2)}$$
$$S''3 = a^{3(i1+511-i2)}$$
$$S''4 = a^{4(i1+511-i2)}$$
$$S''5 = a^{5(i1+511-i2)}$$

Since the correction of 1 bit is finished, and the residual error bit is 1 bit, the operation defines as the defector A="0" detector 1116 and the detector B="0" detector 1117 hereinafter and performs the checking similarly. When the operation shifts the register by 2(i2-il), the values of S'1, S'2, S'3, S'4 and S'5 are as follows.

[Equation 5]

$$S'1 = a^{i1+511-i2-i1+i2} = 1$$
$$S'2 = a^{2(i1+511-i2-i1+i2)} = 1$$
$$S'3 = a^{3(i1+511-i2-i1+i2)} = 1$$
$$S'4 = a^{4(i1+511-i2-i1+i2)} = 1$$
$$S'5 = a^{5(i1+511-i2-i1+i2)} = 1$$

At this instance, using S"1=S'1, S"2=S'2+1, S"3=S'3+1, S"4=S'4+1 and S"5=S'5+1, the operation checks the value of the detector A, or S"1 and the value of the detector B, or $S''2^2+S''1 \cdot S''3$. In this case, the value of the detector A or the value of the "0" detector 1116 is 0 Further, the value of the detector B or the value of the "0" detector 1117 is 0 (S1212). Accordingly, the operation corrects the output of the FIFO $a_m+1$ to $a_n+1+1=a_n$ (S1216). Next, the operation controls the multiplexers 1116 through 1120 and stores S"1, S"2, S"3, S"4 and S"5 to the syndrome circulators 1111 through 1115 (S1217). Therefore, the following values are stored in the syndrome circulators 1111 through 1115.

$$S''1 = 0$$
$$S''2 = 0$$
$$S''3 = 0$$
$$S''4 = 0$$
$$S''5 = 0$$

The correction is finished at this point. The residual data is outputted to the buffer successively through the FIFO. In this way, the on-the-fly error correcting circuit 613 can correct an error of 2 bits or less with respect to one code language.

As stated above, the error correction can be performed in decoding after deleting the inserted "1".

As shown in FIG. 1, the error allowable byte synchronization circuit which can allow an error to some degree, is provided at the prior stage of the on-the-fly error correcting circuit, so that the synchronization can be performed even when an error occurs at the BYTESYNC portion.

Figure 17:
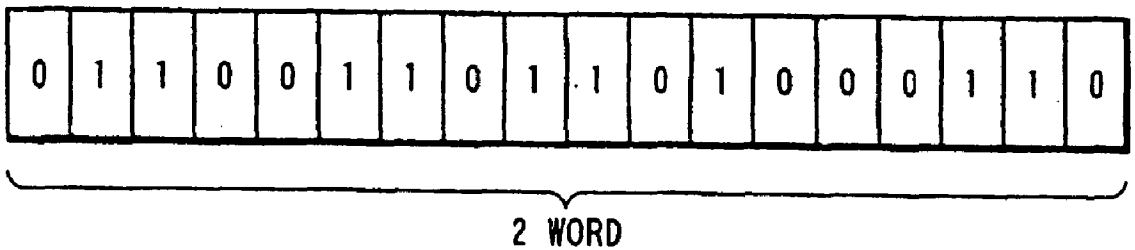
FIG. 17 illustrates a BYTESYNC pattern in accordance with the invention.
Figure 18:
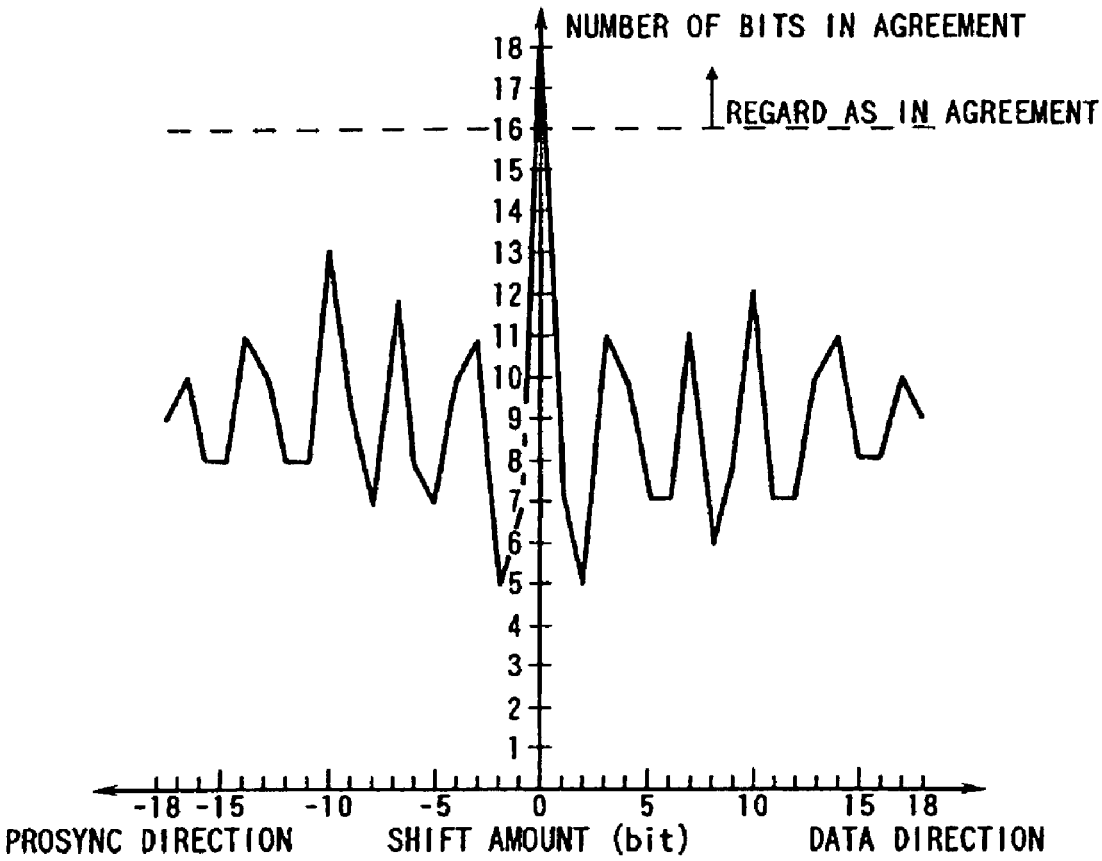
FIG. 18 is an autocorrelation diagram of the BYTESYNC pattern in accordance with the invention.
Figure 19:
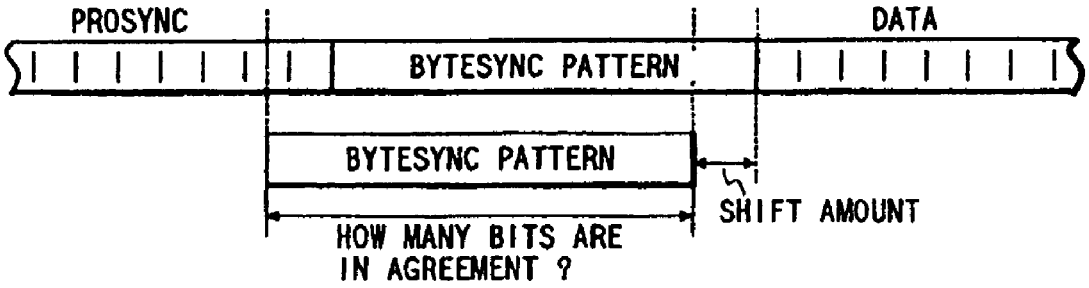
FIG. 19 is an explanatory diagram of the autocorrelation diagram.
Figure 20:
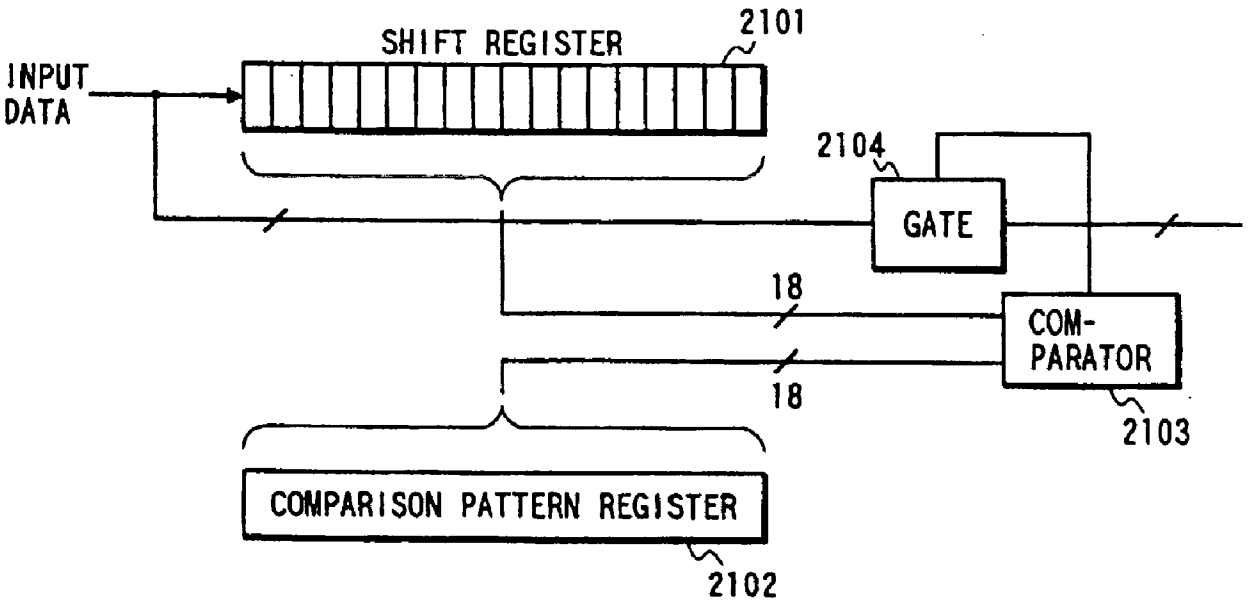
FIG. 20 is a block diagram of an error allowable BYTESYNC circuit in accordance with the invention.
Figure 21:
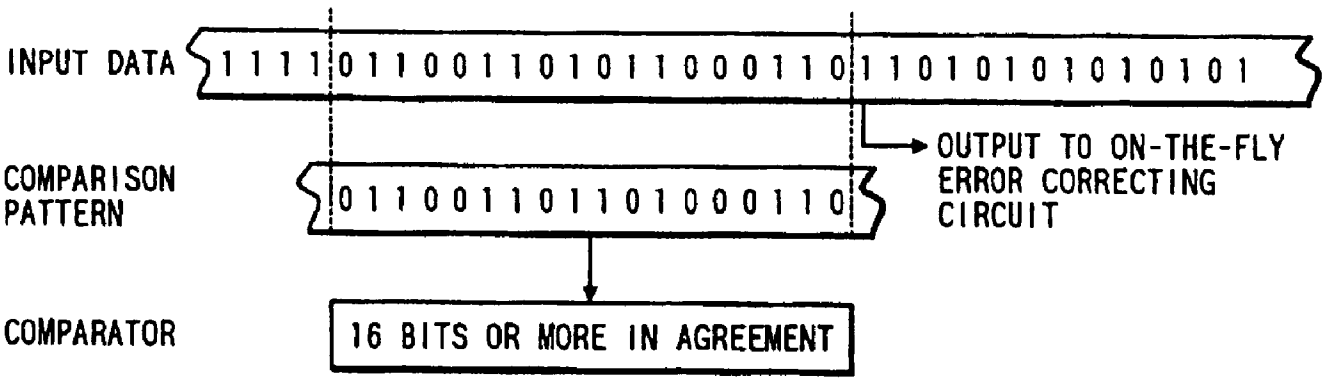
FIG. 21 is an explanatory diagram of the operation of the error allowable BYTESYNC circuit in accordance with the invention.

The BYTESYNC is a pattern of 2 words which has previously been calculated by simulation, as shown in FIG. 17. FIG. 18 shows how many bits are in agreement in case wherein a pattern by which the pattern of the BYTESYNC is connected with the PROSYNC having a pattern of "1111 . . . " therebefore and connected with the data thereafter, as shown in FIG. 19, is compared with this pattern of the BYTESYNC by successively shifting it bit by bit. As is apparent by referring to FIG. 18, when the pattern of the BYTESYNC is employed, the amount of agreement is 13 bits or less unless the shift amount is 0, or unless the both are totally in agreement. When the shift amount is 0, 14 bits are in agreement even when a 4 bits error occurs. When the shift amount is not 0, only 13 bits or less are in agreement when an error does not occur. Therefore, the pattern of the BYTESYNC can allow an error of 2 bits or less by regarding the synchronization as established, when bits of 14 or more, for instance, bits of 16 or more are in agreement. The error allowable byte synchronization circuit 611 of FIG. 1 will be described with reference to FIGS. 20 and 21. FIG. 20 shows a block diagram of the error allowable byte synchronization circuit 611. The error allowable byte synchronization circuit 611 is composed of a shift register 2101, a comparison pattern register 2102 for memorizing the pattern of BYTESYNC, a comparator 2103 for comparing the BYTESYNC pattern with data and a gate 2104.

In FIG. 20, the input data which has beta inputted from the signal processing circuit 110 shown in FIG. 1, is inputted to the shift register 2101. The comparator 2103 compares the value of the shift register 2101 with the value of the comparison pattern register 2102 which stores the value shown in FIG. 17, and outputs it to the on-the-fly error correcting circuit such that the pattern of the BYTESYNC is detected when bits of 16 or more are in agreement. As stated above, this pattern is not in agreement therewith when the agreed bits are 13 or less, and it can be regarded as sufficiently in agreement when bits of 14 or more, or 16 or more in this example are in agreement. When this error allowable byte synchronization circuit is employed, the synchronization signal can be found in this way on the HDC after allowing an error of 2 bits at the data portion and at the leading portion of the identification portion.

According to this example, the synchronization can be detected by the pattern of the BYTESYNC before performing the 8–8 conversion, and further the synchronization can be performed even when an error of several bits occurs with respect to the pattern of the BYTESYNC.

Figure 22:
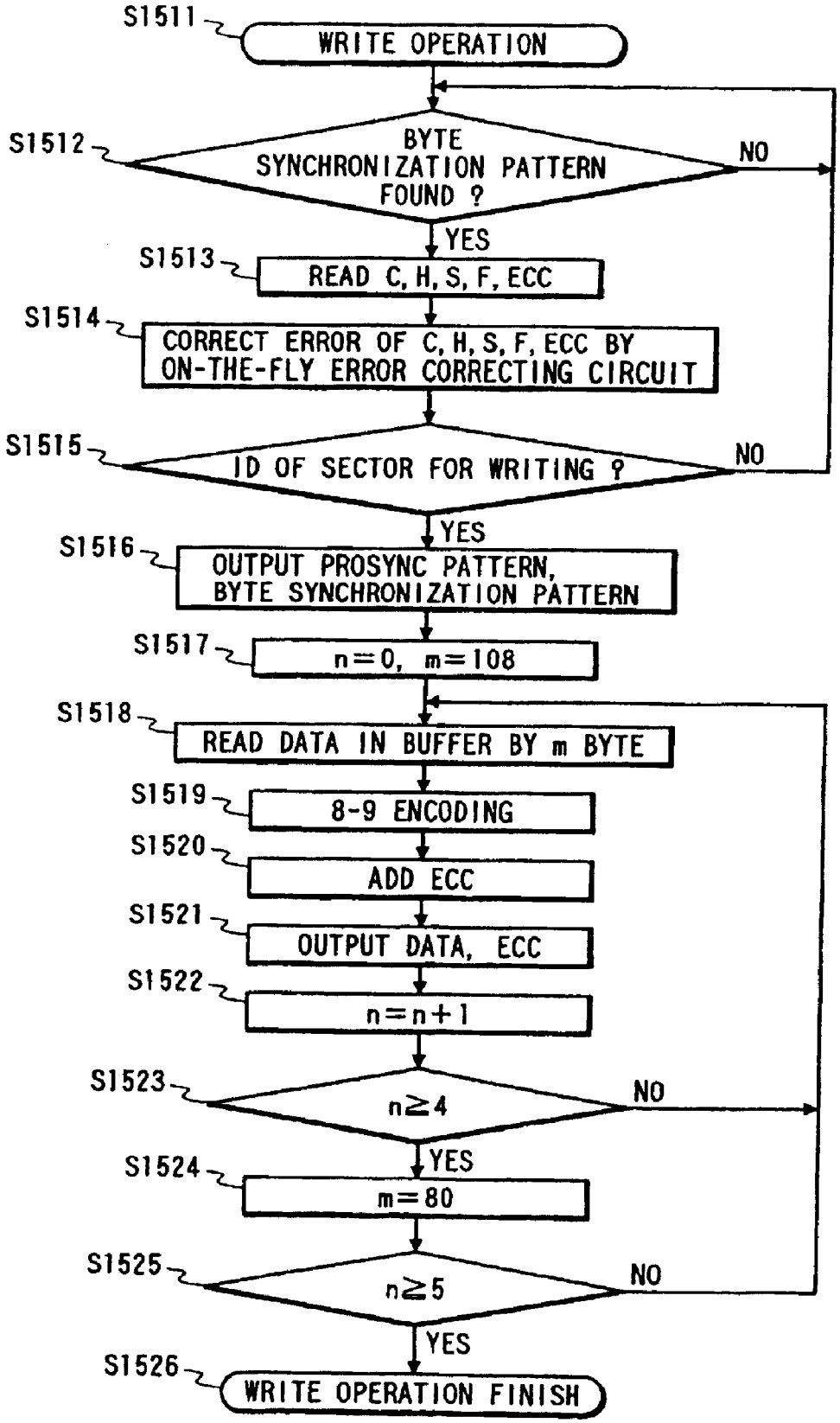
FIG. 22 is a flowchart of a writing operation of a format control unit in accordance with the invention.
Figure 23:
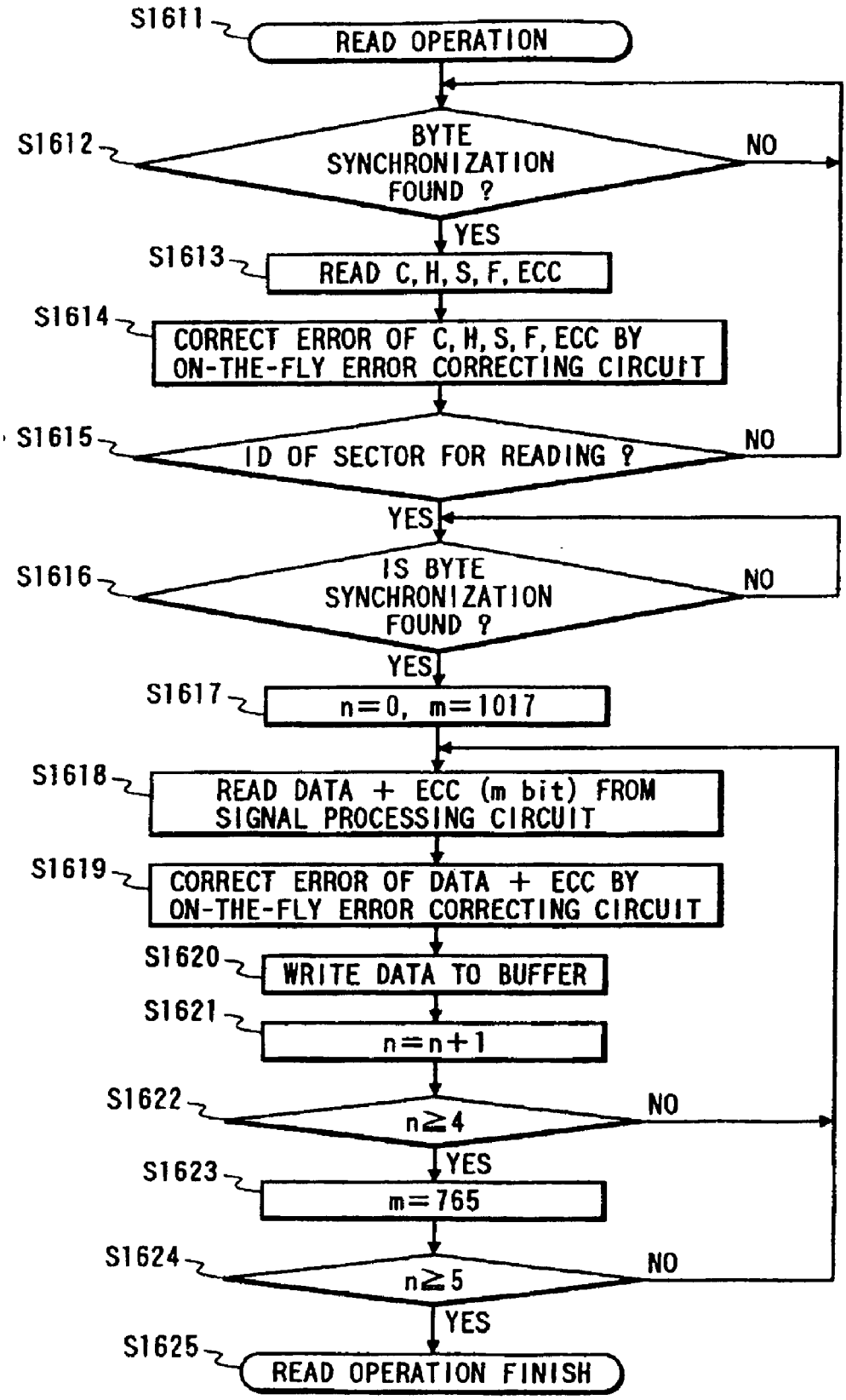
FIG. 23 is a flowchart of a reading operation of the format control unit in accordance with the invention.

The writing and reading operations of data to and from the magnetic disk in this example, will now be described with reference to FIGS. 1, 3, 4, 22 and 23. FIG. 22 shows a control flowchart for writing at the HDC 104 whereas FIG. 23 shows a control flowchart for reading at the HDC 104.

In FIG. 1, in writing data to the disk 109, the write data inputted from the host computer 10] is stored in the data buffer 111 through the interface bus 102, the interface controller 103 and the HDC 104. In the HDC 104, the operation performs a control as shown in the flowchart of FIG. 22. The control of the HDC 104 can be performed at the format controlling unit 614. Further, the identification portion that is added with the error correcting code as shown in FIG. 4 is recorded on the magnetic disk, in formatting.

First, the signal processing circuit 110 reads the identification portion of the magnetic disk and sends the BYTESYNC pattern in the BYTESYNC region to the HDC 104 when the synchronization of data is established in the PROSYNC region. In FIG. 22, in the HDC 104, the error allowable byte synchronization circuit 611 performs a matching of the above-mentioned BYTESYNC pattern (S1512), and when the BYTESYNC pattern is found, reads the succeeding C (cylinder), H (head), S (sector), F (flag) and ECC (error correcting code), (S1S13). Next, the on-the-fly error correcting circuit 613 corrects errors of C, H, S, F and ECC (S1514), the identification checking circuit 612 checks whether the identification or a sector to be written and the read identification are in agreement or not (S1515), and the operation returns to the detecting of the BYTESYNC region of the identification portion again when they are not in agreement. When the identifications are in agreement, the format control unit 614 successively outputs the PROSYNC pattern and the BYTESYNC pattern and write them on the magnetic disk (S1516). Next, the operation reads 1118 bytes of data that is stored in the buffer (S1517, S1518), and encodes data of 8 bits into data of 9 bits in the 8–8 encoding circuit 609 (S1519). After performing the 8–8 encoding, in the ECC generating circuit 616, the operation adds the above-mentioned error correcting code of 45 bits to the data (S1520), and outputs the data added with the error correcting code to the PR processing unit 615. In the PR processing unit 615, the operation performs the preceding, and writes the data to the disk 109 through the AMP 107 (S1521). The operation repeats this procedure by 4 times (S1522, S1523), and reads the final residual of 80 bytes (S1524, S1525, S1518). The operation performs the 8–8 encoding in the 8–8 encoding circuit 609 similarly with respect to the residual 80 bytes (S1519), and add the error correcting code of 45 bits at the ECC generating circuit 616 (S1520), and output the data added with the error correcting code to the PR processing unit 615. The operation performs the preceding at the PR processing unit 615 and writes the data on the disk 109 through the AMP 107 (S1521).

Through this operation, in the magnetic disk device of this example, the error correcting code is added after the 8–8 encoding, and the data can be written on the magnetic disk while satisfying the run length limitation.

In reading data from the disk, the magnetic information written on the magnetic disk 109 is converted into an electric signal by the head 108, the voltage thereof is amplified by the R/W AMP 107, and decoded by the PRML 110. In the PRML 110, the decoding is performed respectively at the even number series decoder 603 for decoding the even number series and the odd number series decoder 604 for decoding the odd number series.

Next, the HDC 104 performs a control as shown in the flowchart of FIG. 23. First, the signal processing circuit 110 reads the identification portion of the magnetic disk, and sends the BYTESYNC pattern of the BYTESYNC region to the HDC 104 when the synchronization of data is established in the PROSYNC region. In FIG. 23, in the HDC 104, the error allowable byte synchronization circuit 611 performs a matching of the above-mentioned BYTESYNC pattern (S1612), and when the BYTESYNC pattern is found, the circuit reads the succeeding C (cylinder), H (head), S (sector), F (flag) and ECC (error correcting code) (S1613). Next, the on-the-fly error correcting circuit 613 corrects an error of C, H, S, F and ECC (S1614), the identification checking circuit 612 checks whether the identification of a sector to be read and the read identification am in agreement or not (S1615), and the operation returns again to the detecting of the BYTESYNC region of the identification portion when they are not in agreement. When the identifications are in agreement, the operation performs the matching of the BYTESYNC pattern again at the error allowable byte synchronization circuit 611 (S1616), and when the BYTESYNC pattern is found, the operation reads the data of 1017 bits and the error correcting code from the signal processing circuit 110 (S1618). Next, in the on-the-fly error correcting circuit 613, the operation comas an error by using the error correcting code as mentioned above (S1619), the operation converts the data from 9 bits into 8 bits in the 8–8 decoder 608 alter the correcting, and stores the converted data in the buffer (S1620). The operation repeats this procedure by 4 times (S1621, S1622), and reads the final residue of 765 bits (S1622, S1623, S1624, S1618). The operation performs the error correction by using the error correcting code at the on-the-fly error correcting circuit 613 similarly with respect to the final residue of 765 bits S1619), converts the corrected data of 9 bits into the NRZ data of 8 bits at the 8–8 decoder 608, and stores the converted data in the buffer (S1620). Thereafter, the operation transfers the data stored in the data buffer 111 to the host computer 101 through the HDC 104, the interface controller 103 and the interface bus 102, by which the reading operation is finished.

By this operation, in the magnetic disk device of this example, the operation can perform the on-the-fly error correction in a state in which the data is encoded by the 8–8 encoder, by which the data can be read from the magnetic disk. Accordingly, the number of bits to be corrected can be restrained to a small value, and the number of redundant bits to be added can be restrained to a small value, thereby making it possible to improve the formal efficiency. Further, by correcting an error using the error correcting code on the run length limited code, the correction in consideration of the error occurrence characteristic of the Partial Response Maximum Likelihood decoding that is performed in the earlier stage, can be performed, whereby an efficient correction can be performed, the number of redundant bits to be added can be rendered small, and the format efficiency can be improved.

In this example, the FIFO is used for temporarily storing data during the on-the-fly error correction. However, the 8–8 conversion code data may be stored in the buffer by providing an exclusive area therein. The following procedure may be performed. The data is convened into the NRZ data and stored in the buffer before the error correction, only a byte thereof to be corrected are again encoded by the 8–8 conversion when the error position is detected, and is convened into the NRZ data and stored in the buffer after the error correction. Thereby, the capacity of the buffer can be made smaller than that when the 8–8 conversion code data is stored therein, since the NRZ data is stored in the buffer. Further, the construction can be generated without the FIFO, by which the amount of hardware can be reduced.

Although the BCH code is employed as the error correcting code in the above example, other error codes such as a Read-Solomon code or the like may be employed.

Figure 24:
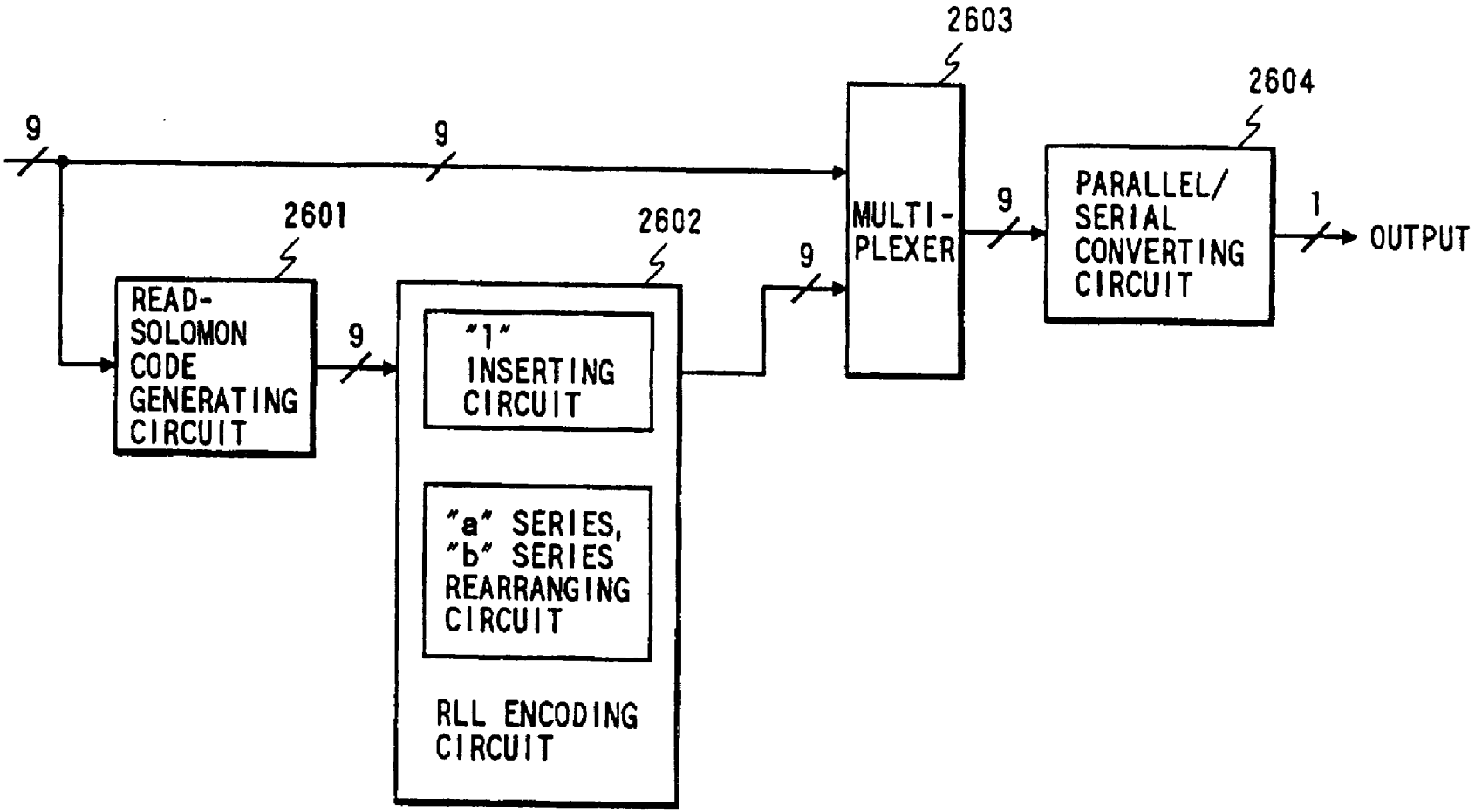
FIG. 24 is a block diagram of a ECC circuit in accordance with another embodiment of the invention.
Figure 25:
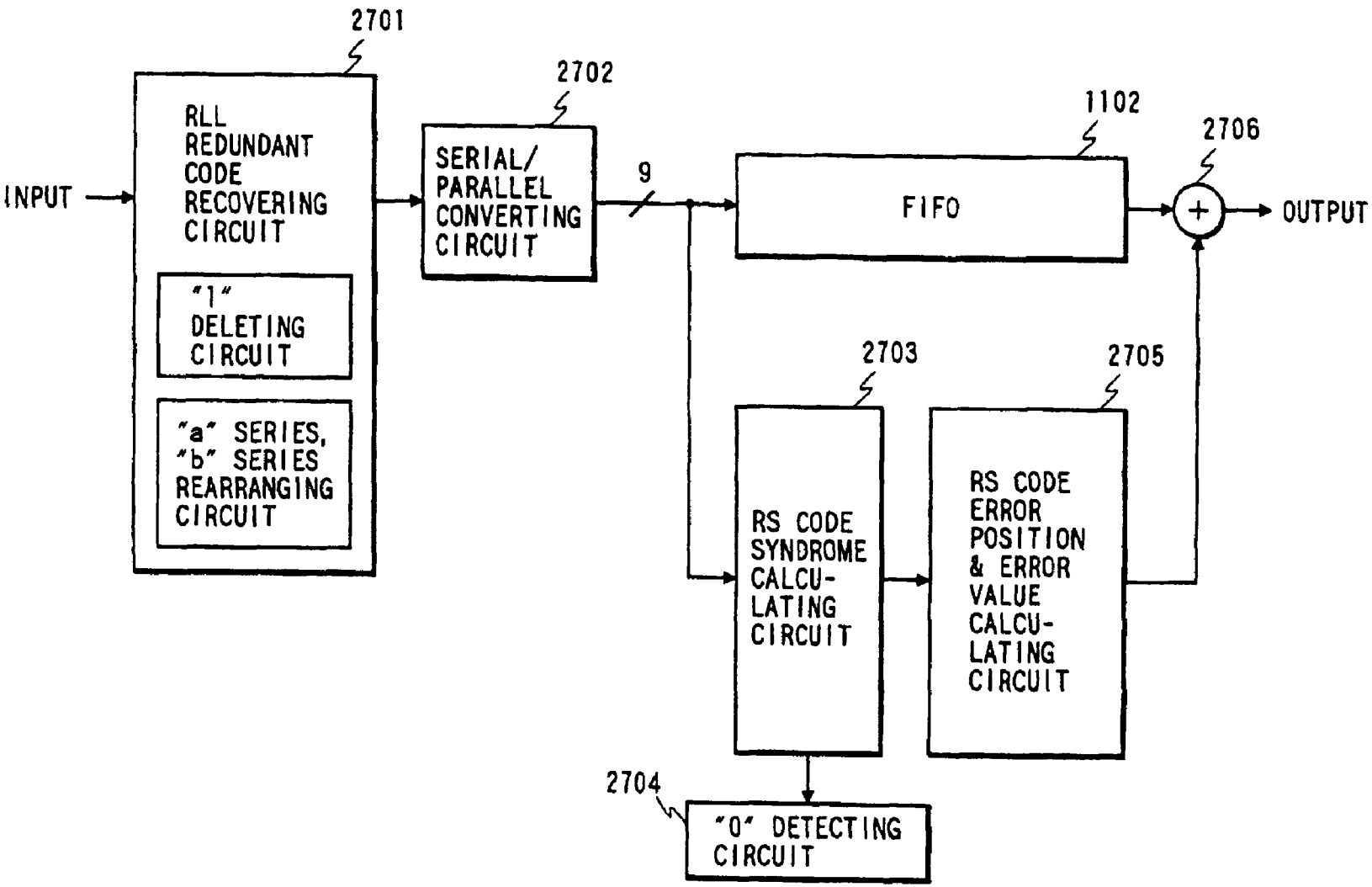
Figure 26:
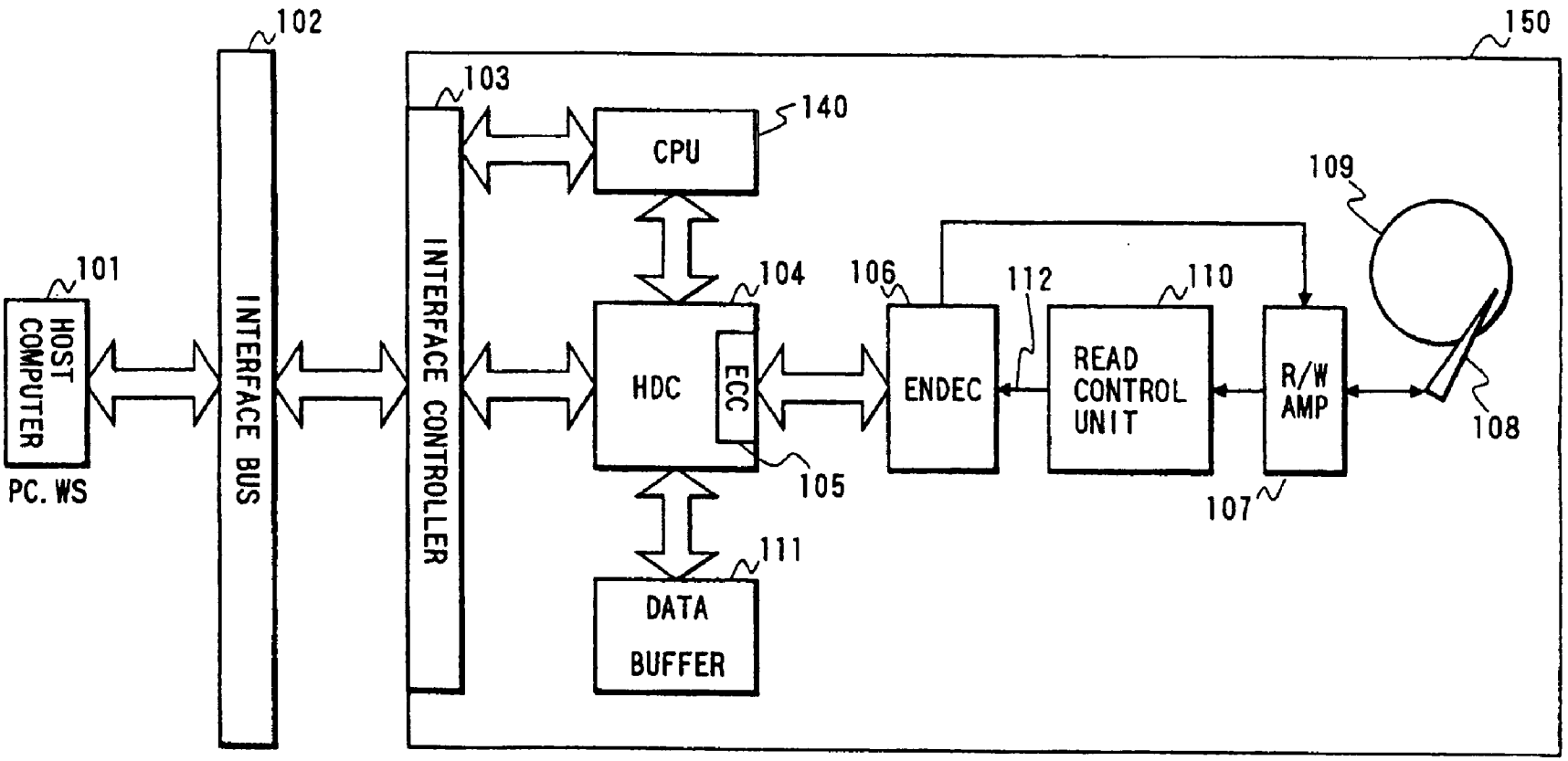
FIG. 26 is a system block diagram of a publicly-known example.
Figure 27:
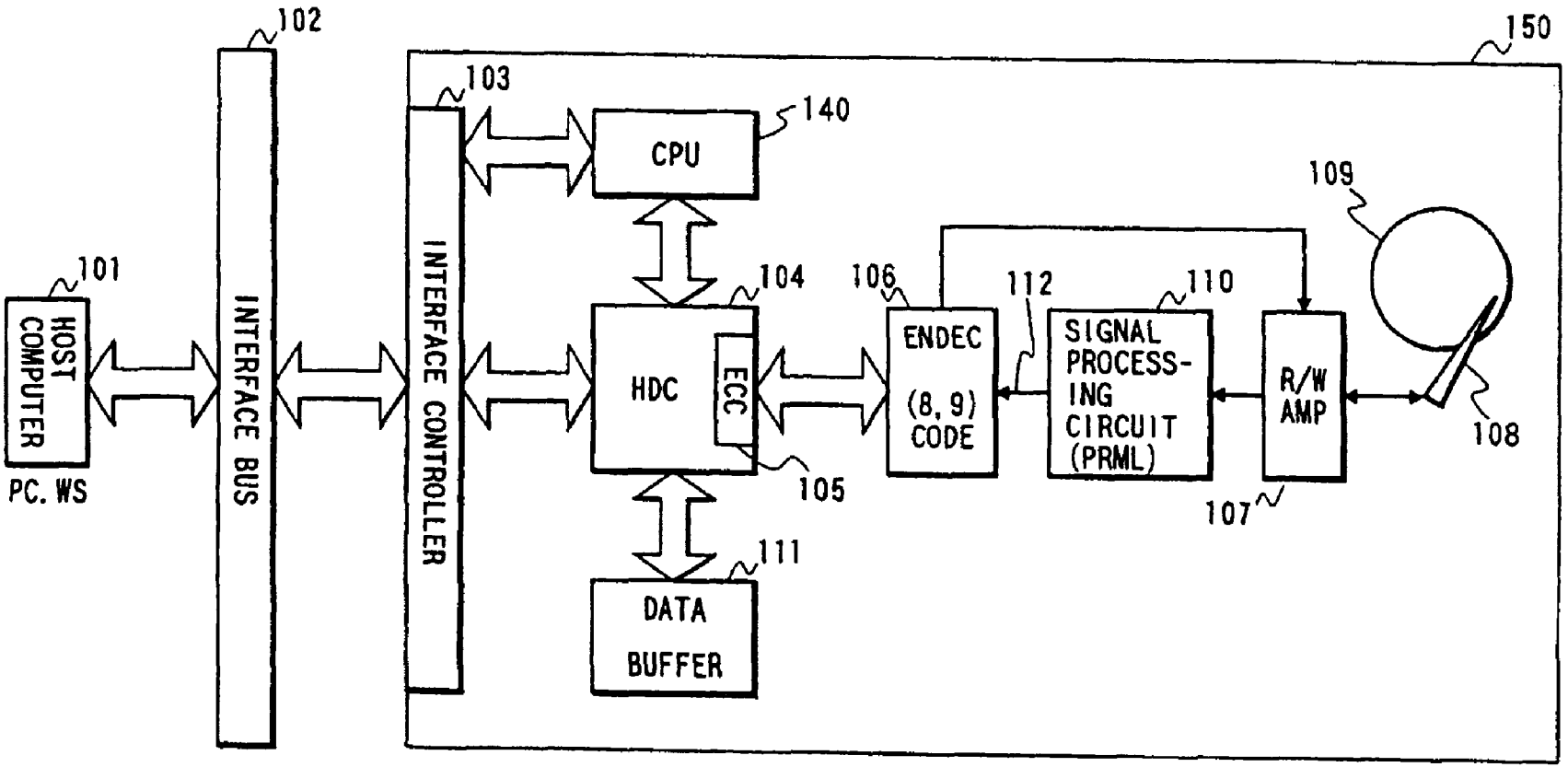
FIG. 27 is a system block diagram of another conventional system.
Figure 28:
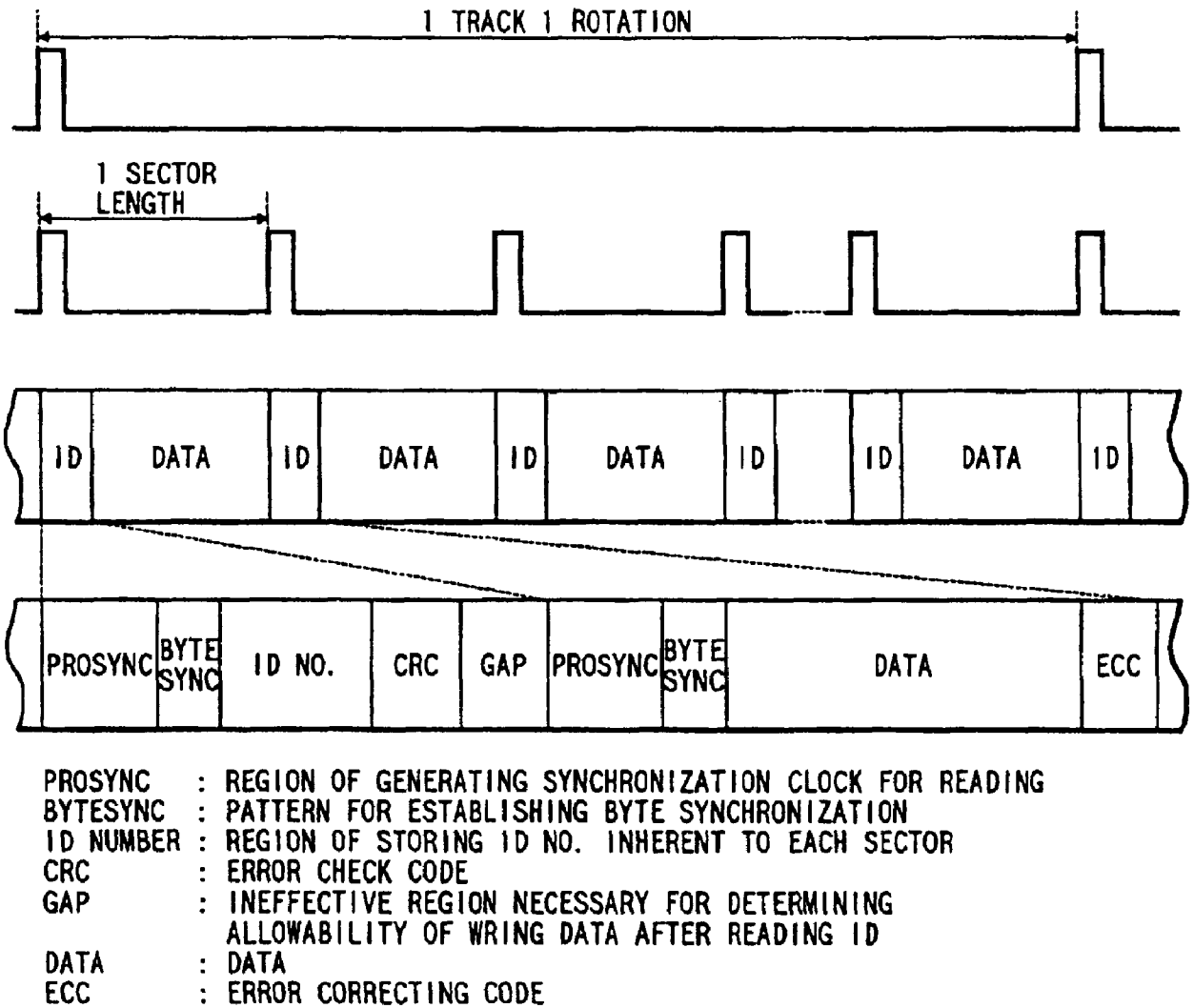
FIG. 28 is a diagram showing a record format of a magnetic disk of the conventional system.
Figure 29:
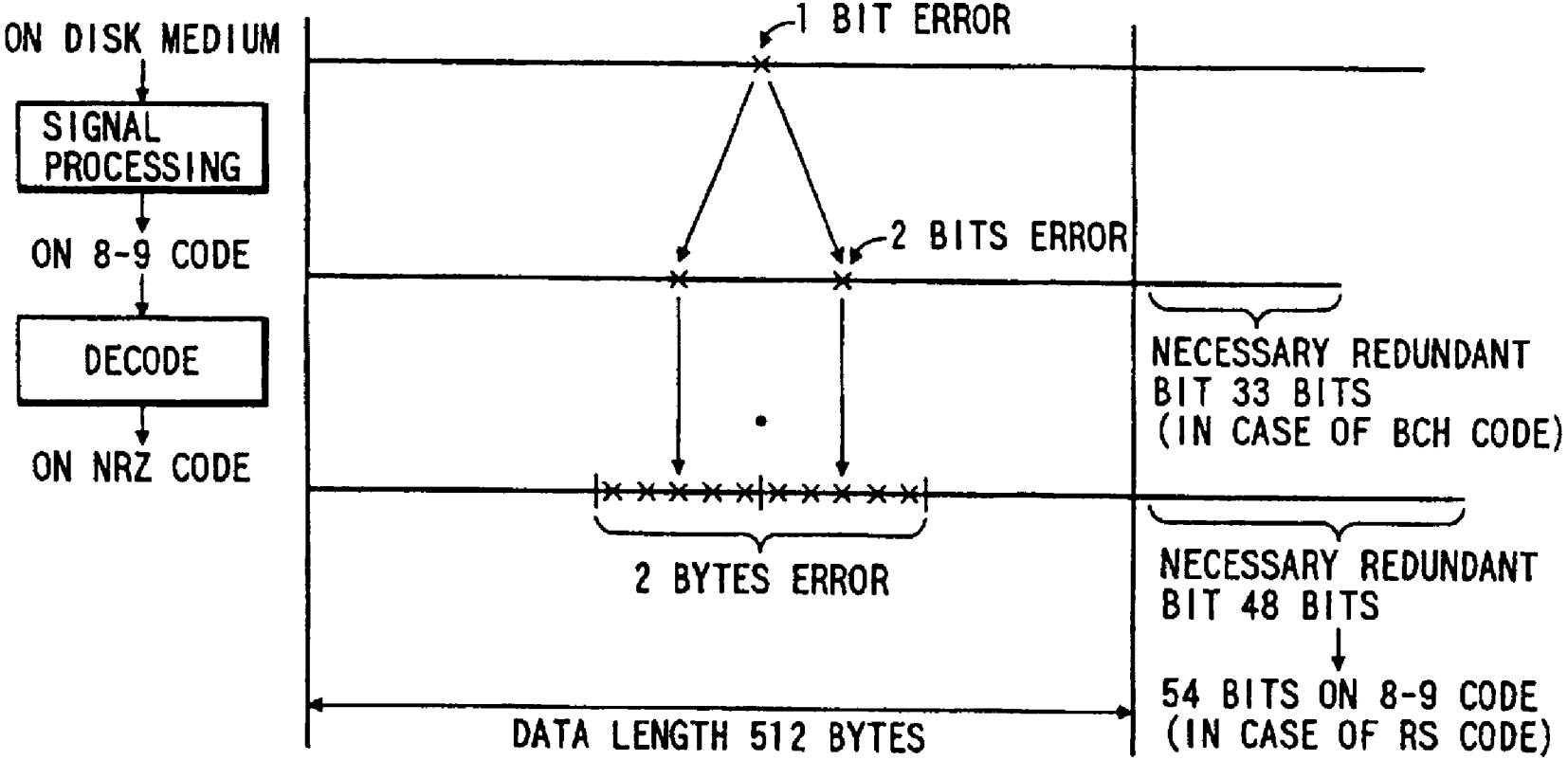
FIG. 29 is an explanatory diagram of an error propagation.

An ECC generating circuit and an on-the-fly error correcting circuit when using a Read-Solomon code are shown in FIGS. 24 and 25. In FIG. 24, a Read-Solomon code generating circuit 2601 is provided instead of the BCH code generating circuit 802 shown in FIG. 7. Also in this case, the functions of a "1" inserting circuit and an "a" series, "b" series rearranging circuit of a RLL coding circuit 2602 can be made similar to those shown in FIG. 7.

In decoding, as shown in FIG. 25, the on-the-fly error correcting circuit is composed of a RLL redundant code recovering circuit 2701 for deleting the inserted "1" and rearranging the even number series and the odd number series, the FIFO 1102, a RS code syndrome calculating circuit 2703 for calculating a state of an error which has occurred in a code language, a "0" detecting circuit 2704 for detecting "0", and a RS code error position and error value calculating circuit 2705 for detecting an error position and an error value based on a value which has been calculated by the RS code syndrome calculating circuit 2703. Also in this case, the error correction by the RS code syndrome calculating circuit 2703 and the RS code error position and error value calculating circuit 2705, is performed by using Read-Solomon code, and with respect to the functions of other blocks, the functions similar to those of the blocks shown in FIG. 10 may be provided.

Although the 8–8 conversion code is employed as the run length limited code in this example, the (1,7) code or the like may similarly be used.

According to this example, through the construction as stated above, as shown in FIG. 4, one portion of each of the "a" series and the "b" series can be corrected by providing the data portion with redundant bits of 5 bytes (45 bits), and 10 positions of error at maximum can be corrected by the redundant bits of 25 bytes in 5 steps. Further, one portion of each of the "a" series and the "b" series can be corrected and two portions of error at maximum can be corrected by providing the identification portion with redundant bits of 5 bytes (45 bits). In correcting on the NRZ signal, in the 3 interleaved construction wherein 1 symbol includes 8 bits in Read-Solomon code, the redundant bits of 6 bytes are necessary since the correction of continuous 3 bytes is necessary for correcting one portion, and addition of the redundant bytes of 60 bytes is necessary to correct error of 10 portions. Compared with the above case, this example can considerably delete the redundant bytes.

In accordance with the present invention, when providing the data portion with the error correcting capability of approximately 10 portions, the format efficiency can be increased by approximately 5%.

As indicated with respect to the conventional technology, when the PRML of class 4 is used as the signal processing system and the 8–8 conversion code is used as the run length limited code, in correcting an error of 1 bit among data read from the disk medium, redundant bits of 48 bits (54 bits in can of converting it into the 8–9 conversion code) at minimum are necessary on the NRZ signal in can wherein the correction is performed by using Read-Solomon code on the NRZ code, and 1 symbol includes 8 bits and under 3 interleaved construction. By contrast, in accordance with the present invention, in performing the correction on the 8–9 conversion code, in case wherein 1 symbol includes 13 bits, the correction can be performed by redundant bytes of 33 bits that is consisted of 26 redundant bits and 7 bits of "1" to be inserted. According to this example, the size of the redundant bits is thus about ⅔ of that in the conventional technology.

Further, according to this example, by using the above-mentioned BYTESYNC pattern, the BYTESYNC can be provided with the error resistance function and several bits of error can be allowed.

The number of bits of error occurrence in correcting and detecting can be reduced by providing the HDC with the 8–6 conversion code decoder. Then the error resistance function of the BYTESYNC the identification portion or the like can be achieved in a simple way and the number of retrials can be reduced.

As explained above, according to the present invention, more redundant bits can be deleted. Accordingly, the format efficiency can be promoted. Further, the correction can be performed in consideration of the occurrence tendency of an error which occurs in the signal processing or the like, and therefore, a very efficient correction can be performed The number of bits of error occurrence in correcting and detecting can be reduced by providing the HDC with the 8–9 conversion encoder/decoder. Therefore, the error resistance function of the BYTESYNC, the identification portion or the like can be achieved in a simple way and the number of retrials can be reduced.

Further, the above examples may be applied to a digital processing device.

According to the present invention, an error can be corrected before propagation of the error which occurs in decoding the run length limited code to the NRZ data by correcting the error on the run length limited code. The number of bits to be corrected can be therefore reduced and the redundant bits coo be reduced.

Further, according to the present invention, the redundant bits of the error correcting code can be reduced in view of the correction capability and the run length limitation can be satisfied in a recording and reproducing device using the run length limited code and using a disk type record medium.

While we have shown and described several embodiments in accordance with the present invention, it is understood that the same is not limited thereto but is susceptible of numerous changes and modifications as known to those skilled in the art, and we therefore do not wish to be limited to the details shown and described herein but intend to cover all such changes and modifications as are encompassed by the scope of the appended claims.

We claim:

1. Apparatus us or at least recording user data to be recorded on a record medium, comprising:

record encoding means for converting original user data into encoded user data of a predetermined record code;

error correcting code generating means for generating original error correcting code data for correcting an error with respect to the encoded user data;

converting means for converting the error correcting code data into encoded correcting code data adapted to the predetermined record code[, the recording means recording the encoded record data and the encoded correcting code data on the recording medium];

recording means including mesas for writing data including the encoded record data and encoded error correcting code data on the record medium; and reproducing means including reading means for reading data from the record medium including the encoded user data and the encoded error correcting code data;

inverse converting means for inversely converting the encoded error correcting code data read by the reading means into the original error correcting code data;

error correcting means for correcting an error with respect to the encoded user data read by the reading means based on the original error correcting code data; and decoding means for decoding the encoded user data having errors which have been corrected by the error correcting means to the original user data.

2. Apparatus according to claim 1, wherein the predetermined record code is a rue length limited code for restricting a continuation of a predetermined first value in a series of the user code data, the convening means converting the error correcting code data into the encoded error correcting code data by inserting a value other than the predetermined value to the error correcting code data generated by the error correcting code generating means so that conversion is effected in accordance with the restriction of the run length limited code, and the inverse converting means inversely converts the encoded error correcting code data into the original error correcting code data by deleting the inserted value which has been inserted by the converting means from the encoded error correcting code data so as to effect conversion in accordance with the restriction of the run length limited code.

3. Apparatus according to claim 2, further comprising:

PRML (Partial Response Maximum Likelihood) processing means performing decoding by a PRML using a PR (Partial Response) Class 4;

pre-coding means for pre-coding the encoded user data and the encoded error correcting code data so that the encoded error correcting code data is adapted to the record code;

the writing means writing the encoded user data and the encoded error correcting code data on the recording medium after pre-coding by the pre-coding means;

the PRML processing means decoding each of the encoded user data and the encoded error correcting code data read by the reading means and encoded by the pre-coding means with respect to every dual series of an odd number series and an even number series;

the converting means rearranging the odd number series and the even number series of the error correcting code data which has been generated by the error correcting code generating means at every insertion of the value other than the predetermined value; and the inverse converting means deleting the value which has been inserted by the converting means from the encoded error correcting code data which has been decoded by the PRML processing means and rearranging the odd number series and the even number series of the error correcting code data at every deletion of the inserted value other than the predetermined value.

4. Apparatus according to claim 1, wherein the error correcting code generating means additionally generates error correcting code data with respect to data at an identification portion when the encoded user data is divided into a plurality of sectors and recorded by adding the identification portion including recognition information to each of the plurality of sectors.

5. Apparatus according to claim 1, further comprising:

writing means for writing a synchronization pattern which is a pattern for previously determined data on the record medium;

synchronization detecting means for comparing the previously determined synchronization pattern with a pattern of data in a data series of the data read by the reading means in an order and determining a pattern of data which is in agreement with the data of the synchronization pattern by at least a predetermined bit number as the synchronization pattern; and wherein the synchronization pattern is a pattern of data which is not in agreement with a pattern of arbitrary data other than the pattern of the data corresponding to the synchronization pattern included in the data series of the data written on the record medium by at least the predetermined bit number and the pattern of the arbitrary data includes the pattern of the data including the data forming the portion of the pattern of the data corresponding to the synchronization pattern.

6. Apparatus according to claim 1, wherein the error correcting means detects an occurrence of on error based on the encoded user data read by the reading means and the original error correcting code data which has been inversely converted by the inverse converting means to perform correction of the error when the error has been detected;

the decoding means decoding the encoded user data read by the reading means and converted by the record encoding means before correction by the error correcting means; the apparatus further comprising:

storing means for temporarily storing the decoded user data decoded by the decoding means; and control means for reading the user data stored by the storing means and corresponding to tbe encoded user data in which an error has been detected when the error is detected by the error correcting means, reconverting the read user data into reconverted encoded user data of the record code, and transmitting the reconverted encoded user data to the error correcting means for correcting the error;

the decoding means redecoding the reconverted encoded user data having the error corrected by the error correcting means to the original user data.

7. Apparatus according to claim 2, wherein the run length limited code is a (0, 4, 4) GCR (Group Coded Recording), and the converting means inserts 1 as the value other than the predetermined value.

8. A method of correcting an error in a recording and reproducing apparatus for recording user data to be recorded on a record medium, comprising the steps of:

converting original use data into an encoded user data of a predetermined record code;

generating an original error correcting code data for correcting an error with respect to the encoded user data;

converting the generated error correcting code data into an encoded error correcting code data adapted to the predetermined record code;

writing the encoded user data and the encoded error correcting code data on the record medium;

reading the encoded user data and the encoded error correcting code data from the record medium;

inversely converting the read encoded error correcting code data to the original error correcting code data;

correcting an error with respect to the read encoded user data based on the original error correcting code data; and decoding the encoded user data having errors which have been corrected by error correction to the original user data.

*9. A storage device for at least recording user data to be recorded on a recording medium, comprising:*

*a record encoder which converts original user data into encoded user data of a predetermined record code;*

*an error correcting code generator which generates original error correcting code for correcting an error with respect to the encoded user data;*

*a convertor which converts the error correcting code data into encoded correcting code data adapted to the predetermined record code;*

*a recorder including a writer which writes data including the encoded record data and encoded error correcting code data on the record medium;*

*a reproducer including a reader which reads data from the record medium including the encoded user data and the encoded error correcting code data;*

*an inverse convertor which inversely converts the encoded error correcting code data read by the reader into the original error correcting code data;*

*an error corrector which corrects an error with respect to the encoded user data read by the reading means based on the original error correcting code data; and*

*a decoder which decodes the encoded user data which have been corrected by the error corrector to the original user data.*

*10. A data storage device, for recording data on a record medium, comprising:*

*a recording medium;*

*a write head;*

*a read head;*

*an interface circuit;*

*a record encoding circuit which converts original data which is provided through said interface circuit, into encoded data of a predetermined record code;*

*an error correcting code generating circuit which generates original error correcting code data for correcting an error with respect to the encoded data;*

*a converting circuit which converts the original error correcting code data into encoded error correcting code data adapted to the predetermined record code;*

*a recording circuit which generates a signal with respect to the encoded data and the encoded error correcting code data which is provided to the write head;*

*a reproducing circuit which reproduces the encoded user data and the encoded error correcting code data from a signal read from said recording medium by said read head;*

*an inverse converting circuit which inversely converts the encoded error correcting code data reproduced by said reproducing circuit into the original error correcting code data;*

*an error correcting circuit which corrects an error with respect to the encoded data read by the reproducing circuit based on the original error correcting code data; and*

*a decoding circuit which decodes the encoded data which have been corrected by the error correcting circuit to the original data.*

*11. A data storage device according to claim 10, wherein the predetermined record code is a run length limited code for restricting a continuation of a predetermined first value in a series of data, and said converting circuit converts the error correcting code data into the encoded error correcting code so that conversion is effected in accordance with the restriction of the run length limited code.*

*12. A data storage device according to claim 10, further comprising:*

*a PRML (Partial Response Maximum Likelihood) processing circuit which performs decoding by a PRML using a PR (Partial Response) class 4; and*

*a pre-coding circuit which pre-codes the encoded user data and the encoded error correcting code data so that the encoded error correcting code data is adapted to the record code.*

*13. A data storage device for recording data on a record medium, comprising:*

*a recording medium;*

*a write head;*

*a read head;*

*an interface circuit;*

*a record encoding circuit which converts original data, which is provided through said interface circuit, into encoded data of a predetermined record code;*

*an error correcting code generating circuit which generates original error correcting code data for correcting an error with respect to the encoded data;*

*a converting circuit which converts the original error correcting code data into encoded error correcting code data adapted to the predetermined record code;*

*a recording circuit which generates a signal with respect to the encoded data and the encoded error correcting code data, and provides the signal to said write head;*

*a reproducing circuit which reproduces the encoded data and the encoded error correcting code data from a signal read from said recording medium by said read head;*

*an inverse converting circuit which inversely converts the encoded error correcting data reproduced by said reproducing circuit into the original error correcting code data;*

*an error checking circuit which checks the encoded data reproduced by said reproducing circuit utilizing the original error correcting code data obtained by said inverse converting circuit whether or not an error with respect to the encoded user data has occurred; and*

*a decoding circuit which decodes the encoded data, which has been checked by the error checking circuit, to the original user data.*

*14. A data storage device according to claim 13, wherein said error checking circuit includes an error correcting circuit which corrects errors if said error checking circuit detects any errors with respect to the encoded data as a result of the check.*

*15. A data storage device according to claim 14, wherein the predetermined record code is a run length limited code for restricting a continuation of a predetermined first value in a series of data, and said converting circuit converts the original error correcting code data into the encoded error correcting code data so that conversion is effected in accordance with the restriction of the run length limited code.*

*16. A data storage device according to claim 14, further comprising:*

*a PRML (Partial Response Maximum Likelihood) processing circuit which performs decoding by a PRML using a PR (Partial Response) class 4; and*

*a pre-coding circuit which pre-codes the encoded data and the encoded error correcting code data so that the encoded error correcting code data is adapted to the record code.*

*17. An apparatus for reproducing original user data from a medium utilizing a signal read from said medium which is indicative of information including encoded user data of a predetermined record code representing the original user data and an encoded error correcting code which is converted in accordance with restriction of the predetermined record code from an original error correcting code which corrects an error of the encoded user data, said information being written on said medium, comprising:*

*a read head which obtains a signal indicative of the information written on said medium from said medium;*

*a reproducing circuit which reproduces the encoded user data and the encoded error correcting code data from the signal read from said medium by said read head;*

*an inverse converting circuit which inversely converts the encoded error correcting code data read by the reproducing circuit into the original error correcting code data;*

*an error correcting circuit which corrects an error with respect to the encoded user data reproduced by said reproducing circuit based on the original error correcting code data; and*

*a decoding circuit which decodes the encoded user data which have been corrected by the error correcting circuit to the original user data.*

*18. An apparatus according to claim 17, wherein the predetermined record code is a run length limited code for restricting a continuation of a predetermined first value in a series of user code data.*

*19. An apparatus for reproducing user data from a recording medium, comprising:*

*a read head;*

*a reproducing circuit block which reproduces encoded user data and encoded error correcting code data from a signal read from said recording medium by said read head, said encoded user data being data obtained by converting the user data in accordance with a restriction of a predetermined record code, and said encoded error correcting code data being data obtained by converting an original error correcting code data generated from the original data in accordance with the restriction of the predetermined record code;*

*an inverse converting circuit block which inversely converts the encoded error correcting code data read by the reproducing circuit into the original error correcting code data;*

*an error checking circuit block which checks the encoded user data utilizing the original error correcting code data whether or not an error with respect to the encoded user data has occurred; and*

*a decoding circuit block which decodes the encoded user data, which has been checked by the error checking circuit block, to the original user data.*

*20. An apparatus according to claim 19, wherein said error checking circuit block includes an error correcting circuit which corrects errors if said error checking circuit block detects any errors with respect to the encoded user data as a result of the check.*

*21. An apparatus according to claim 20, wherein said predetermined record code is a run length limited code for restricting a continuation of a predetermined first value in a series of the user data.*

* * * * *